US012641803B2

(12) United States Patent
Koo et al.

(10) Patent No.: US 12,641,803 B2
(45) Date of Patent: May 26, 2026

(54) SEMICONDUCTOR DEVICE INCLUDING FERROELECTRIC LAYER, DIELECTRIC LAYER, AND CHARGE TRAP SITE, AND METHOD OF FABRICATING THE SAME

(71) Applicant: SK hynix Inc., Icheon-si (KR)

(72) Inventors: Won Tae Koo, Icheon-si (KR); Dong Ik Suh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 443 days.

(21) Appl. No.: 17/738,568

(22) Filed: May 6, 2022

(65) Prior Publication Data

US 2023/0170381 A1     Jun. 1, 2023

(30) Foreign Application Priority Data

Nov. 30, 2021     (KR) ........................ 10-2021-0169548

(51) Int. Cl.
  *H10D 1/68*          (2025.01)
  *H10B 53/30*         (2023.01)
(52) U.S. Cl.
  CPC ............. *H10D 1/684* (2025.01); *H10B 53/30* (2023.02); *H10D 1/688* (2025.01)
(58) Field of Classification Search
  CPC ................................. H01L 28/56; H10B 53/30
  See application file for complete search history.

(56) References Cited

U.S. PATENT DOCUMENTS

| | | | |
|---|---|---|---|
| 10,210,921 B1 | 2/2019 | Hwang | |
| 2009/0008702 A1* | 1/2009 | Ramaswamy | ......... B82Y 10/00 257/E21.294 |
| 2009/0127611 A1* | 5/2009 | Park | ................... H10D 30/6891 257/326 |
| 2015/0179819 A1* | 6/2015 | Kim | ................. H01L 21/02282 438/287 |
| 2017/0365719 A1 | 12/2017 | Chen et al. | |
| 2018/0166448 A1* | 6/2018 | Cheng | ................. H10B 12/056 |
| 2020/0203499 A1* | 6/2020 | Chang | ................. H01L 29/7786 |
| 2020/0212168 A1* | 7/2020 | Yoo | ........................ H10D 1/684 |
| 2020/0286985 A1 | 9/2020 | Lim et al. | |
| 2020/0350324 A1* | 11/2020 | Hoffmann | .............. H10B 53/30 |

FOREIGN PATENT DOCUMENTS

CN             104733464 A       6/2015

* cited by examiner

*Primary Examiner* — Norman D Richards
*Assistant Examiner* — Bruce R. Smith

(57)        ABSTRACT

A semiconductor device includes a first electrode, a ferroelectric layer disposed on the first electrode, a dielectric layer disposed on the ferroelectric layer, charge trap sites disposed in an inner region of the dielectric layer, and a second electrode disposed on the dielectric layer. The dielectric layer may have a non-ferroelectric property. The dielectric layer and the ferroelectric layer are disposed between the first electrode and the second electrode and connected in series to each other. The semiconductor device may include charge trap sites distributed in an inner region of the dielectric layer having a non-ferroelectric property.

10 Claims, 27 Drawing Sheets

SEMICONDUCTOR DEVICE INCLUDING FERROELECTRIC LAYER, DIELECTRIC LAYER, AND CHARGE TRAP SITE, AND METHOD OF FABRICATING THE SAME

CROSS-REFERENCE TO RELATED APPLICATIONS

The present application claims priority under 35 U.S.C. § 119(a) to Korean Application No. 10-2021-0169548, filed on Nov. 30, 2021 in the Korean Intellectual Property Office, which is incorporated herein by reference in its entirety.

BACKGROUND

1. Technical Field

The present disclosure generally relates to a semiconductor device, and more particularly, to a semiconductor device including charge trap sites and a method of fabricating the same.

2. Related Art

As a feature size of a semiconductor chip decreases, the sizes of a capacitor and a transistor disposed in the semiconductor chip also decrease. However, the capacitance required for a dielectric layer included in the capacitor or the transistor needs to maintain a predetermined reference value in order to ensure reliability of device operation. Accordingly, various methods for increasing the capacitance of the dielectric layer used in the capacitor or the transistor are being studied.

As a representative example of the various methods, a high dielectric material may be utilized in the dielectric layer of the capacitor or transistor. Recently, as the trend in feature size reduction of semiconductor chips continues, various attempts have been made to secure high dielectric properties in the dielectric layer, to reduce leakage current, and to increase breakdown voltage.

SUMMARY

A semiconductor device according to an embodiment of the present disclosure may include a first electrode, a ferroelectric layer disposed over the first electrode, a dielectric layer disposed over the ferroelectric layer, charge trap sites disposed in an inner region of the dielectric layer, and a second electrode disposed over the dielectric layer.

A semiconductor device according to another embodiment of the present disclosure may include a substrate, a storage node electrode disposed over the substrate, a plate electrode disposed to be spaced apart from the storage node electrode, a ferroelectric layer and a dielectric layer that are disposed between the storage node electrode and the plate electrode, and charge trap sites disposed in an inner region of the dielectric layer. The ferroelectric layer and the dielectric layer are electrically connected in series to each other to provide a non-ferroelectric property.

In a method of fabricating a semiconductor device according to further another embodiment of the present disclosure, a first electrode may be formed on a substrate. A ferroelectric layer may be formed on the first electrode. A dielectric layer including dopant particles distributed therein and having a non-ferroelectric property may be formed on the ferroelectric layer. A second electrode may be formed on the dielectric layer.

In a method of fabricating a semiconductor device according to further another embodiment of the present disclosure, a first electrode may be formed on a substrate. A ferroelectric layer may be formed on the first electrode. A first sub-dielectric layer having a non-ferroelectric property may be formed on the ferroelectric layer. Metal particles may be distributed on the first sub-dielectric layer. A second sub-dielectric layer covering the metal particles may be formed on the first sub-dielectric layer. A second electrode may be formed on the second sub-dielectric layer.

BRIEF DESCRIPTION OF THE DRAWINGS

FIG. 6 is a cross-sectional view schematically illustrating a semiconductor device according to another embodiment of the present disclosure.

DETAILED DESCRIPTION

Figure 1:
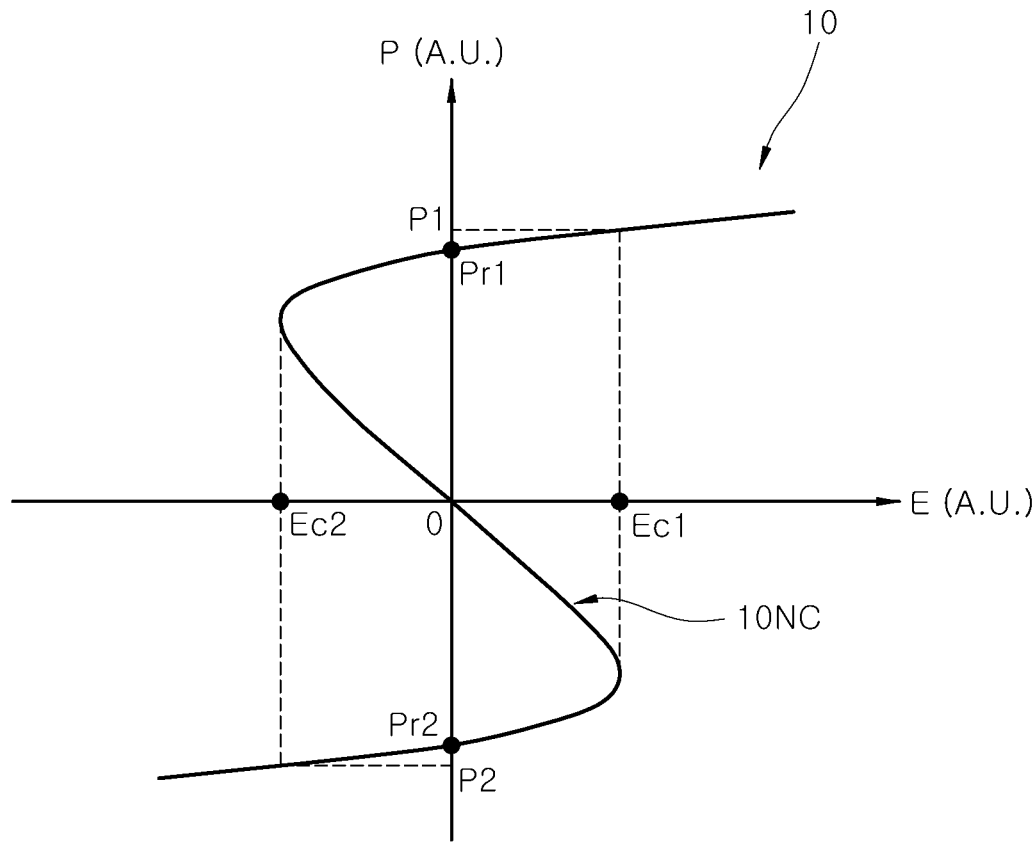
FIG. 1 is a graph schematically illustrating a polarization property of a ferroelectric layer according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Figure 2:
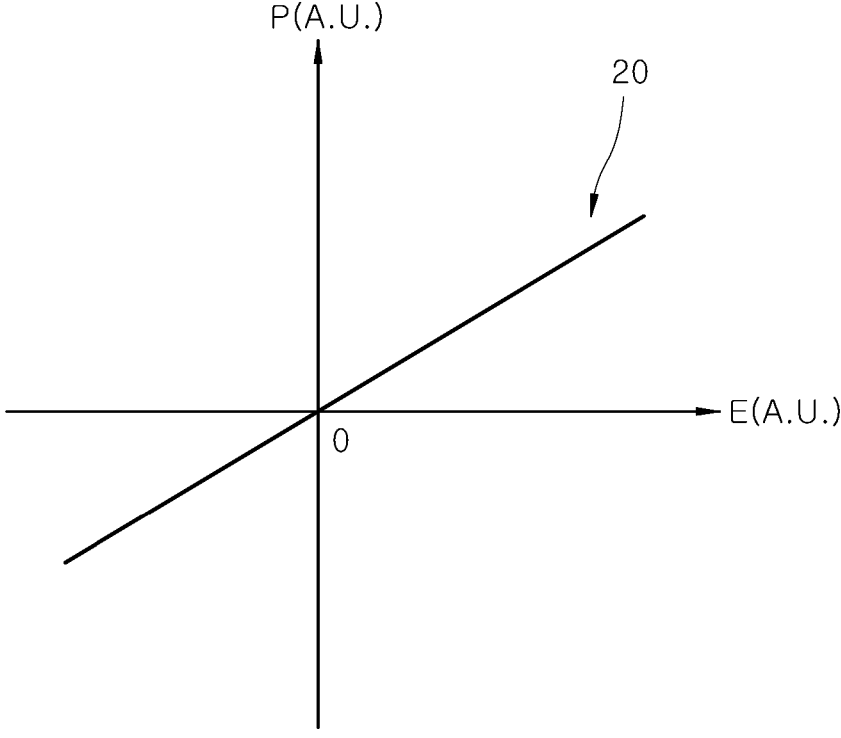
FIG. 2 is a graph schematically illustrating a polarization property of a dielectric layer according to an embodiment of the present disclosure.

FIG. 1 is a graph 10 schematically illustrating a polarization property of a ferroelectric layer according to an embodiment of the present disclosure. Specifically, the graph 10 may illustrate a change in polarization of a ferroelectric layer when an electric field is applied to both ends of the ferroelectric layer. FIG. 2 is a graph 20 schematically illustrating a polarization property of a dielectric layer according to an embodiment of the present disclosure. Specifically, the graph 20 may be a graph illustrating a change in polarization of a dielectric layer when an electric field is applied to both ends of the dielectric layer.

Referring to the graph 10 of FIG. 1, a ferroelectric layer may have first and second remanent polarization Pr1 and Pr2 and first and second coercive fields Ec1 and Ec2. The first and second remanent polarization Pr1 and Pr2 may be polarization that can be maintained in the ferroelectric layer in a state in which no electric field is applied to the ferroelectric layer. The first and second coercive fields Ec1 and Ec2 may denote the electric fields required to switch the polarization orientation of the ferroelectric layer in opposite directions. The absolute values of the first and second coercive fields may be the same.

Referring to the graph 10 of FIG. 1, in an embodiment, when the ferroelectric layer has the second remanent polarization Pr2 in an initial state, an electric field E may be applied to the ferroelectric layer while sweeping in a positive direction. When the electric field E reaches the first coercive field Ec1, the polarization of the ferroelectric layer may be changed to have the first polarization P1 after passing through a negative slope portion 10NC on the graph 10.

The capacitance of the ferroelectric layer may be proportional to a ratio $\Delta P/\Delta E$ of the polarization change $\Delta P$ depending on an electric field change $\Delta E$ on the graph 10. Accordingly, in an electric field section corresponding to the negative slope portion 10NC of the graph 10, the ferroelectric layer may exhibit negative capacitance. That is, when the ferroelectric layer performs polarization switching at the first coercive field Ec1, the ferroelectric layer may pass through the portion of the graph 10NC and exhibit negative capacitance. Conversely, in the graph 10 of FIG. 1, in the remaining electric field portions except for the negative slope portion 10NC, the ferroelectric layer may exhibit positive capacitance.

Referring to the graph 20 of FIG. 2, the polarization behavior of the dielectric layer according to the electric field is illustrated. In this specification, unless otherwise specified, the dielectric layer may have a non-ferroelectric property. As an example, the dielectric layer may have a paraelectric property.

Referring to the graph 20 of FIG. 2, an electric field E may be applied to both ends of the dielectric layer while sweeping in a positive direction or a negative direction. The polarization P of the dielectric layer may increase from zero in proportion to a magnitude of the applied electric field E. When the electric field E is removed from the dielectric layer, the magnitude of the polarization may return to zero. In other words, when no electric field is applied to the dielectric layer, the dielectric layer may maintain a state in which polarization is not formed or retained.

Meanwhile, the capacitance of the dielectric layer may be proportional to the ratio $\Delta P/\Delta E$ of the polarization change $\Delta P$ depending on the electric field change $\Delta E$ on the graph 20. Accordingly, the dielectric layer associated with the graph 20 of FIG. 2 may have positive capacitance.

Although not necessarily limited to any given theory, when the ferroelectric layer is combined with a dielectric layer to form a dielectric structure, the ferroelectric layer may more stably exhibit negative capacitance in the dielectric structure, compared to a case in which the ferroelectric layer is used as a single layer or in which the dielectric structure is formed with the ferroelectric layer but without the dielectric layer. In addition, the dielectric structure in which the ferroelectric layer is combined with the dielectric layer might not exhibit a ferroelectric property as a whole. That is, the dielectric structure might not have remanent polarization. As an example, the dielectric structure may have a paraelectric property.

Figure 3:
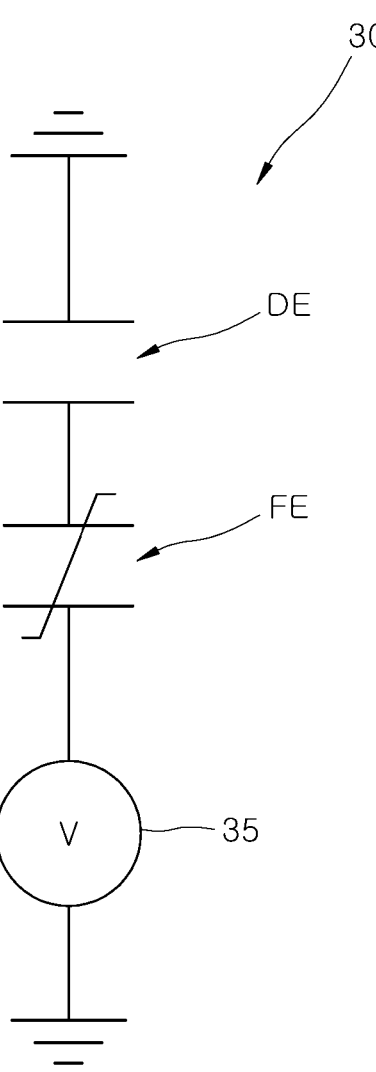
FIG. 3 is a view schematically illustrating an electrical circuit configuration of a dielectric structure according to an embodiment of the present disclosure.

FIG. 3 is a view schematically illustrating an electrical circuit configuration of a dielectric structure 30 according to an embodiment of the present disclosure. Referring to FIG. 3, the dielectric structure 30 may include a dielectric layer DE and a ferroelectric layer FE that are electrically connected in series to each other. When a voltage is applied to both ends of the dielectric structure 30 by a power supply 35, the capacitance $C_T$ of the dielectric structure 30 may be calculated by the following equation (1).

$$1/(C_T)=1/(C_{DE})+1/(C_{FE}) \tag{1}$$

Here, $C_{DE}$ is capacitance of the dielectric layer DE, and $C_{FE}$ is capacitance of the ferroelectric layer FE.

When the dielectric layer DE has positive capacitance and the ferroelectric layer FE has negative capacitance in a predetermined voltage range, the capacitance $C_T$ of the dielectric structure 30 may be greater than the capacitance $C_{DE}$ of the dielectric layer DE. As such, when the ferroelectric layer FE and the dielectric layer DE are electrically connected in series to each other to form the dielectric structure 30, the capacitance $C_T$ of the dielectric structure 30 may be greater than the capacitance $C_{DE}$ of the dielectric layer DE.

Accordingly, as will be described in various embodiments below, it is possible to enable a semiconductor device to implement capacitance greater than that of the dielectric layer DE, within a predetermined operating voltage range, by including the dielectric layer DE in the dielectric structure 30 and arranging the dielectric layer DE and the ferroelectric layer FE in electrical series. In addition, semiconductor devices according to embodiments of the present disclosure may include charge trap sites disposed in an inner region of the dielectric layer DE. The charge trap sites may increase the amount of charges in the dielectric layer DE through operations of trapping and de-trapping electrons, which may improve endurance of the semiconductor device.

Figure 4:
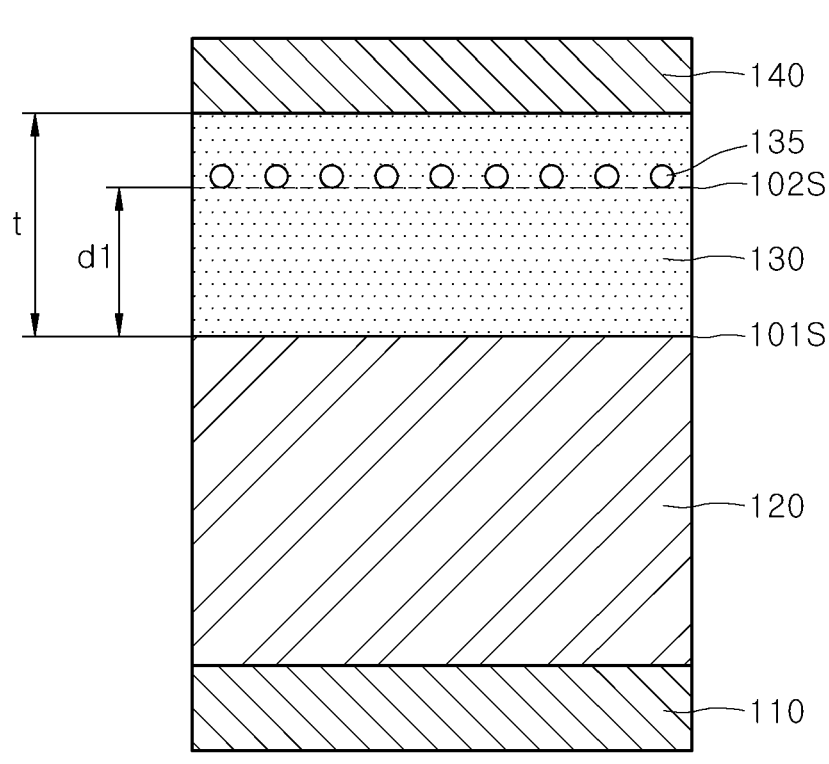
FIG. 4 is a cross-sectional view schematically illustrating a semiconductor device according to an embodiment of the present disclosure.

FIG. 4 is a cross-sectional view schematically illustrating a semiconductor device 1 according to an embodiment of the present disclosure. Referring to FIG. 4, the semiconductor device 1 may include a first electrode 110, a ferroelectric layer 120 disposed over the first electrode 110, a dielectric layer 130 disposed over the ferroelectric layer 120, charge trap sites 135 disposed in an inner region of the dielectric layer 130, and a second electrode 140 disposed over the dielectric layer 130. In the semiconductor device 1, the ferroelectric layer 120 and the dielectric layer 130 may be configured to be electrically connected in series to each other. A device structure including the ferroelectric layer 120 and the dielectric layer 130 connected in series to each other may have a non-ferroelectric property, that is, non-ferroelectricity as a whole. In the present specification, the non-ferroelectricity may mean that a dielectric material or structure does not have remanent polarization and therefore does not have a coercive field. As an example, the non-ferroelectricity may mean paraelectricity.

The first electrode 110 may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 4, the ferroelectric layer 120 may be disposed on the first electrode 110. The ferroelectric layer 120 may have a ferroelectric property, that is, ferroelectricity described with reference to FIG. 1. In an embodiment, the ferroelectric layer 120 may have remanent polarization and a coercive field. In addition, the ferroelectric layer 120 may implement negative capacitance in a predetermined electric field range.

In an embodiment, the ferroelectric layer 120 may include hafnium oxide, hafnium zirconium oxide, or a combination thereof. In another embodiment, the ferroelectric layer 120 may include hafnium oxide doped with a dopant, hafnium zirconium oxide doped with the dopant, or a combination thereof. The dopant may stabilize the ferroelectricity of the ferroelectric layer 120. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

In an embodiment, the ferroelectric layer 120 may have a crystal structure of an orthorhombic crystal system. The ferroelectric layer 120 may have a thickness of, for example, one nanometer (1 nm) to four nanometers (4 nm).

Referring to FIG. 4, the dielectric layer 130 may be disposed on the ferroelectric layer 120. The dielectric layer 130 may have a non-ferroelectric property, that is non-ferroelectricity. In an embodiment, the dielectric layer 130 may have a paraelectric property, that is, paraelectricity. The dielectric layer 130 may have a thickness of, for example, one nanometer (1 nm) to four nanometers (4 nm).

The dielectric layer 130 may include, for example, hafnium oxide, hafnium zirconium oxide, or a combination thereof. The dielectric layer 130 may have a crystal structure that is different from that of the ferroelectric layer 120. For example, the dielectric layer 130 may have a crystal structure of the monoclinic crystal system or the tetragonal crystal system.

A dielectric constant of the dielectric layer 130 may be smaller than that of the ferroelectric layer 120. That is, the dielectric constant of a dielectric material constituting the dielectric layer 130 may be lower than that of a ferroelectric material constituting the ferroelectric layer 120.

Referring to FIG. 4, the charge trap sites 135 may be disposed in the inner region of the dielectric layer 130. The charge trap sites 135 may include dopant particles or metal particles. The charge trap sites 135 may be concentrated in an area within the dielectric layer 130. In an embodiment, when the charge trap sites 135 include dopant particles, the dopant particles may have a peak concentration in an inner region of the dielectric layer 130 that is spaced apart from an interface 101S between the ferroelectric layer 120 and the dielectric layer 130 by a predetermined distance d1.

Figure 5:
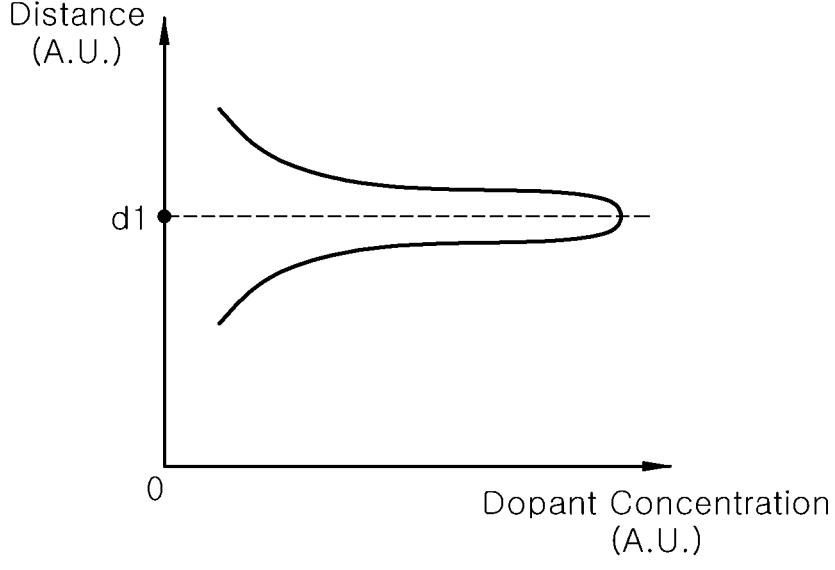
FIG. 5 is a graph schematically illustrating concentration distribution of dopant particles in a dielectric layer according to an embodiment of the present disclosure.

FIG. 5 is a graph schematically illustrating a concentration distribution of dopant particles in a dielectric layer according to an embodiment of the present disclosure. In FIG. 5, the semiconductor device illustrated in FIG. 4 may include the dielectric layer. The concentration of the dopant particles in the dielectric layer may peak in concentration at a location spaced apart from the interface 101S, which is between the ferroelectric layer 120 and the dielectric layer 130, by the predetermined distance d1. The concentration of the dopant particles decreases in the dielectric layer away from the predetermined distance d1. As illustrated in FIG. 5, as the concentration deviates from the predetermined distance d1, the concentration of the dopant particle may decrease rapidly because the dopant particles may be distributed on a plane 102S substantially spaced apart from the interface 101S by the predetermined distance d1. The plane 102S may be a plane substantially parallel to the interface 101S.

In an embodiment, the predetermined distance d1 may be less than the thickness t of the dielectric layer 130 and greater than ½ of the thickness t of the dielectric layer 130. Accordingly, the dopant particles may be disposed closer to the second electrode 140 than the ferroelectric layer 120. In another embodiment (not illustrated), the predetermined distance d1 may be substantially equal to ½ of the thickness t of the dielectric layer 130. Accordingly, the dopant particles may be positioned at substantially the same distance from the ferroelectric layer 120 and the second electrode 140. In yet another embodiment (not illustrated), the predetermined distance d1 may be greater than zero (0) and less than ½ of the thickness t of the dielectric layer 130. Accordingly, the dopant particles may be disposed closer to the ferroelectric layer 120 than the second electrode 140.

The dopant particle may include, for example, boron (B), aluminum (Al), gallium (Ga), indium (In), phosphorus (P), arsenic (As), antimony (Sb), bismuth (Bi), silicon (Si), or a combination of two or more thereof. The dopant particles may be injected into the dielectric layer 130 by a doping method, as will be described later in connection with FIGS. 7A to 7D and FIGS. 8A to 8D.

In an embodiment, when the charge trap sites 135 include metal particles, the metal particles may be distributed on a plane 102S, which is spaced apart from the interface 101S between the ferroelectric layer 110 and the dielectric layer 130 by the predetermined distance d1. The plane 102S on which the metal particles 130 are distributed may be substantially parallel to the interface 101S that is between the ferroelectric layer 120 and the dielectric layer 130.

In an embodiment, the predetermined distance d1 may be smaller than the thickness t of the dielectric layer 130 and greater than ½ of the thickness t of the dielectric layer 130. Accordingly, the metal particles may be disposed closer to the second electrode 140 than the ferroelectric layer 120. In another embodiment (not illustrated), the predetermined distance d1 may be substantially equal to ½ of the thickness t of the dielectric layer 130. Accordingly, the metal particles may be positioned at substantially the same distance from the ferroelectric layer 120 and the second electrode 140. In yet another embodiment (not illustrated), the predetermined distance d1 may be greater than zero (0) and less than ½ of the thickness t of the dielectric layer 130. Accordingly, the metal particles may be disposed closer to the ferroelectric layer 120 than the second electrode 140.

The metal particles may have a shape in which metal atoms are aggregated. For example, the metal particle may have a spherical shape. However, it is not necessarily limited thereto, and other three-dimensional shapes are possible. In an embodiment, the diameter of the metal particle having a spherical shape may have, for example, a size of 0.1 nm to 5 nm. The metal particle may include, for example, cobalt (Co), nickel (Ni), copper (Cu), iron (Fe), platinum (Pt), gold (Au), silver (Ag), iridium (Ir), ruthenium (Ru), palladium (Pd), manganese (Mn), or a combination of two or more thereof. The metal particles may be disposed in the inner region of the dielectric layer 130 by a method described later with reference to FIGS. 9A to 9D.

Referring to FIG. 4, the second electrode 140 may be disposed on the dielectric layer 130. The second electrode 140 may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Hereinafter, the function of the charge trap site 135 according to an embodiment of the present disclosure will be described. When a voltage is applied between the first electrode 110 and the second electrode 140, the charge trap sites 135 may trap or de-trap electrons according to the polarity of the voltage.

As an example, when the first electrode 110 is grounded and a bias having a negative polarity is applied to the second electrode 140 to perform a first write operation, electrons may be injected into the dielectric layer 130, and the charge trap sites 135 may trap the electrons. Accordingly, the charge trap sites 135 may have negative charges. As another example, when the first electrode 110 is grounded and a bias having a positive polarity is applied to the second electrode 140 to perform a second write operation, the electrons trapped in the charge trap sites 135 may be separated from the charge trap sites 135 and may move towards the second electrode 140. Due to the electron de-trapping, the charge trap site 135 may lose a negative charge or gain a positive charge. As such examples, when the first and second write operations are performed, the amount of charge inside the dielectric layer 130 may be increased through the trap and de-trap operations of the charge trap sites 135. Accordingly, a positive capacitance of the dielectric layer 130 may be increased based on the increased amount of the charge. In addition, because the dielectric layer 135 having the increased positive capacitance is combined with the ferroelectric layer 120 with the negative capacitance, the overall capacitance of the semiconductor device 1 may be increased.

In addition, during the first write operation, the charge trap sites 135 may trap the electrons injected from the second electrode 140, so that the movement of the injected electrons to the ferroelectric layer 120 may be prevented or suppressed. Without the charge trap sites 135, the electrons injected from the second electrode 140 into the dielectric layer 130 may easily move to the ferroelectric layer 120. Some of the electrons that move toward the ferroelectric layer 120 are pinning to ferroelectric domains or defect sites inside the ferroelectric layer 120, thereby preventing the polarization switching of the ferroelectric layer 120. Accordingly, the ferroelectricity of the ferroelectric layer 120 may deteriorate. As a result, as the number of cycles of first and second write operations increase, the reliability and endurance of a semiconductor device for storing electrical signals may be eroded.

In contrast, in a semiconductor device 1 according to an embodiment of the present disclosure, the charge trap sites 135 may trap the electrons injected from the second electrode 140 into the ferroelectric layer 120, which effectively blocks the electrons from being fixed inside the ferroelectric layer 120. As a result, the decrease in reliability and endurance of the semiconductor device 1 may be prevented or slowed.

Figure 6:
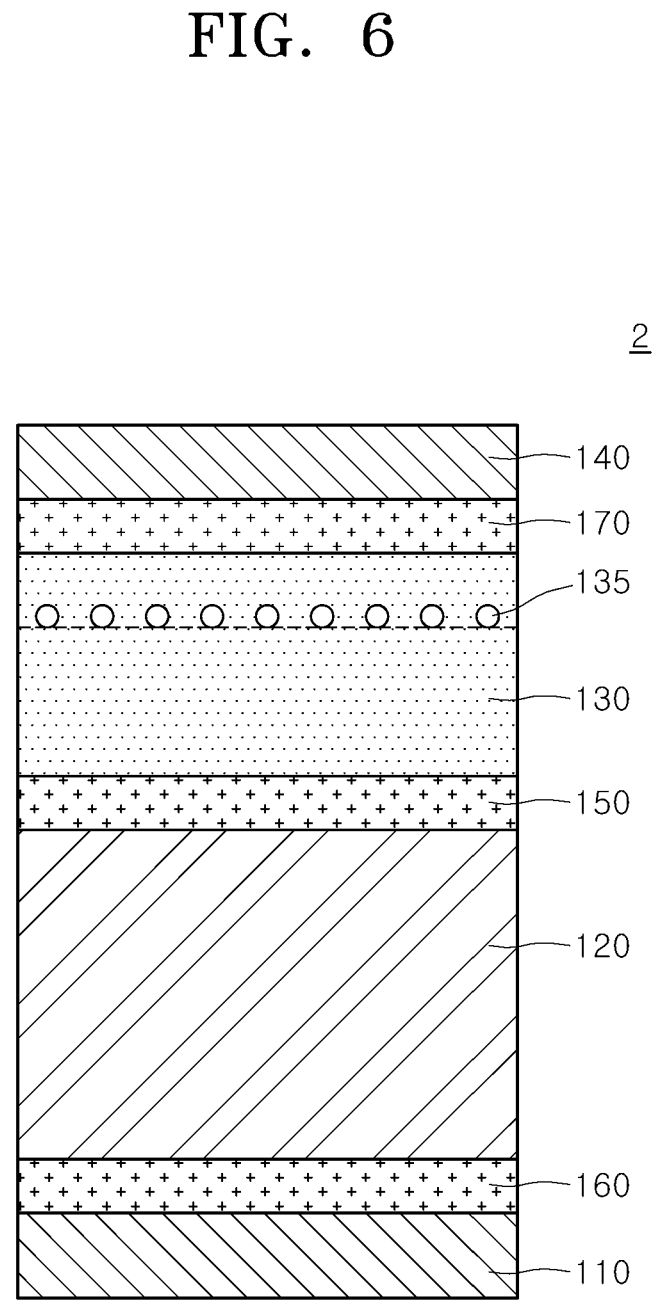

FIG. 6 is a cross-sectional view schematically illustrating a semiconductor device 2 according to another embodiment of the present disclosure. Referring to FIG. 6, the semiconductor device 2 may further include first to third barrier insulation layers 150, 160, and 170, compared to a semiconductor device 1 of FIG. 4. In FIG. 6, the same reference numerals as in FIG. 4 denote the same components.

The first barrier insulation layer 150 may be disposed between a ferroelectric layer 120 and a dielectric layer 130. The first barrier insulation layer 150 may suppress material exchange between the ferroelectric layer 120 and the dielectric layer 130. Accordingly, it is possible to prevent the material compositions of the ferroelectric layer 120 and the dielectric layer 130 from being changed or altered. As a result, a ferroelectric property of the ferroelectric layer 120 and a non-ferroelectric property of the dielectric layer 130 may be stabilized. In addition, the effect of increasing capacitance by connecting the ferroelectric layer 120 and the dielectric layer 130 in series may be reliably implemented in the semiconductor device 2.

The first barrier insulation layer 150 may have a band gap energy that is greater than the band gap energy of each of the ferroelectric layer 120 and the dielectric layer 130. Accordingly, the first barrier insulation layer 150 may form a potential barrier between the ferroelectric layer 120 and the dielectric layer 130. Accordingly, the first barrier insulation layer 150 may reduce leakage current generated at an interface between the ferroelectric layer 120 and the dielectric layer 130 during the operation of the semiconductor device 2. As a result, the breakdown voltage of the semiconductor device 2 may increase.

In an embodiment, the first barrier insulation layer 150 may have an amorphous structure. The first barrier insulation layer 150 may include, for example, aluminum oxide, yttrium oxide, magnesium oxide, or a combination of two or more thereof.

The second barrier insulation layer 160 may be disposed between a first electrode 110 and the ferroelectric layer 120. The second barrier insulation layer 160 may suppress material exchange between the first electrode 110 and the ferroelectric layer 120. Accordingly, it is possible to prevent the material composition of the ferroelectric layer 120 from being changed.

The band gap energy of the second barrier insulating layer 160 may be greater than the band gap energy of the ferroelectric layer 120. Accordingly, the second barrier insulation layer 160 may form a potential barrier between the first electrode 110 and the ferroelectric layer 120. As a result, during the operation of the semiconductor device 2, the second barrier insulation layer 160 may reduce leakage current generated at an interface between the first electrode 110 and the ferroelectric layer 120, and may increase the breakdown voltage of the semiconductor device 2.

The third barrier insulation layer 170 may be disposed between the dielectric layer 130 and a second electrode 140. The third barrier insulation layer 170 may suppress material exchange between the dielectric layer 130 and the second electrode 140. Accordingly, it is possible to prevent the material composition of the dielectric layer 130 from being changed.

In addition, the band gap energy of the third barrier insulation layer 170 may be greater than the band gap energy of the dielectric layer 130. Accordingly, the third barrier insulation layer 170 may form a potential barrier between the dielectric layer 130 and the second electrode 140. As a result, the third barrier insulation layer 170 may reduce leakage current generated at an interface between the dielectric layer 130 and the second electrode 140 during the operation of the semiconductor device 2, and may increase the breakdown voltage of the semiconductor device 2.

In an embodiment, each of the second and third barrier insulation layers 160 and 170 may include aluminum oxide, yttrium oxide, magnesium oxide, or a combination of two or more thereof.

In some embodiments, the second barrier insulation layer 160 or the third barrier insulation layer 170 may be omitted. For example, the second barrier insulation layer 160 may be omitted when the ferroelectric layer 120 forms a sufficiently large potential barrier with respect to the first electrode 110. That is, when the leakage current generated at the interface between the ferroelectric layer 120 and the first electrode 110 is sufficiently suppressed, the second barrier insulation layer 160 may be omitted. Similarly, the third barrier insulation layer 170 may be omitted when the dielectric layer 130 forms a sufficiently large potential barrier with respect to the second electrode 140. That is, when the leakage current generated at the interface between the dielectric layer 130 and the second electrode 140 is sufficiently suppressed, the third barrier insulation layer 170 may be omitted.

Figure 7A:
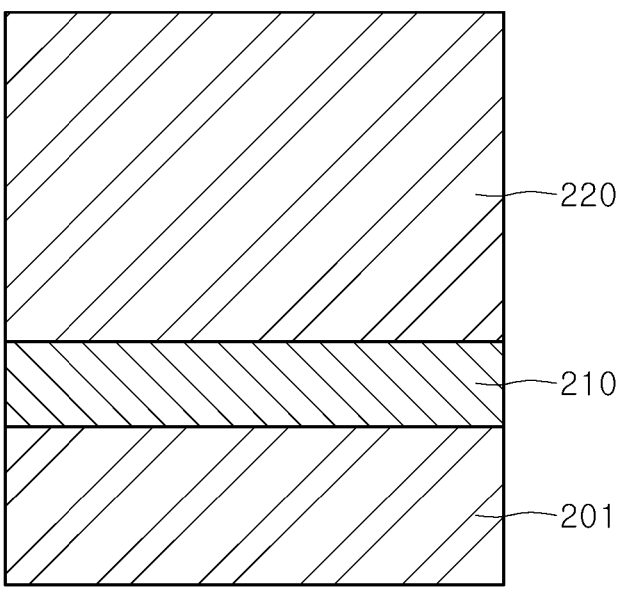
FIGS. 7A to 7D are cross-sectional views schematically illustrating a method of fabricating a semiconductor device according to an embodiment of the present disclosure.

FIGS. 7A to 7D are cross-sectional views schematically illustrating a method of fabricating a semiconductor device according to an embodiment of the present disclosure. Referring to FIG. 7A, a substrate 201 may be provided. The substrate 201 may include a semiconductor material or an insulating material. As an example, the substrate 201 may include silicon (Si), germanium (Ge), gallium arsenide (GaAs), aluminum oxide ($Al_2O_3$), silicon oxide ($SiO_2$), or the like.

A first electrode 210 may be formed on the substrate 201. The first electrode 210 may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first electrode 210 may be formed using a chemical vapor deposition method, a sputtering method, an atomic layer deposition method, or the like.

Although not illustrated in FIG. 7A, an insulation layer may be formed between the substrate 201 and the first electrode layer 210. The insulation layer may include, for example, oxide, nitride, or oxynitride. The insulation layer may electrically insulate the substrate 201 and the first electrode layer 210 from each other.

A ferroelectric layer 220 may be formed on the first electrode 210. In an embodiment, the ferroelectric layer 220 may include hafnium oxide, hafnium zirconium oxide, or a combination thereof. In another embodiment, the ferroelectric layer 220 may include, for example, hafnium oxide doped with a dopant, hafnium zirconium oxide doped with the dopant, or a combination thereof. The dopant may stabilize the ferroelectric property of the ferroelectric layer 220. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof. The ferroelectric layer 220 may be formed, for example, using a chemical vapor deposition method, an atomic layer deposition method, a pulsed-laser deposition method, or the like.

In an embodiment, the ferroelectric layer 220 may include a crystal structure of an orthorhombic crystal system. The ferroelectric layer 220 may have a thickness of, for example, 1 nm to 4 nm.

Figure 7B:
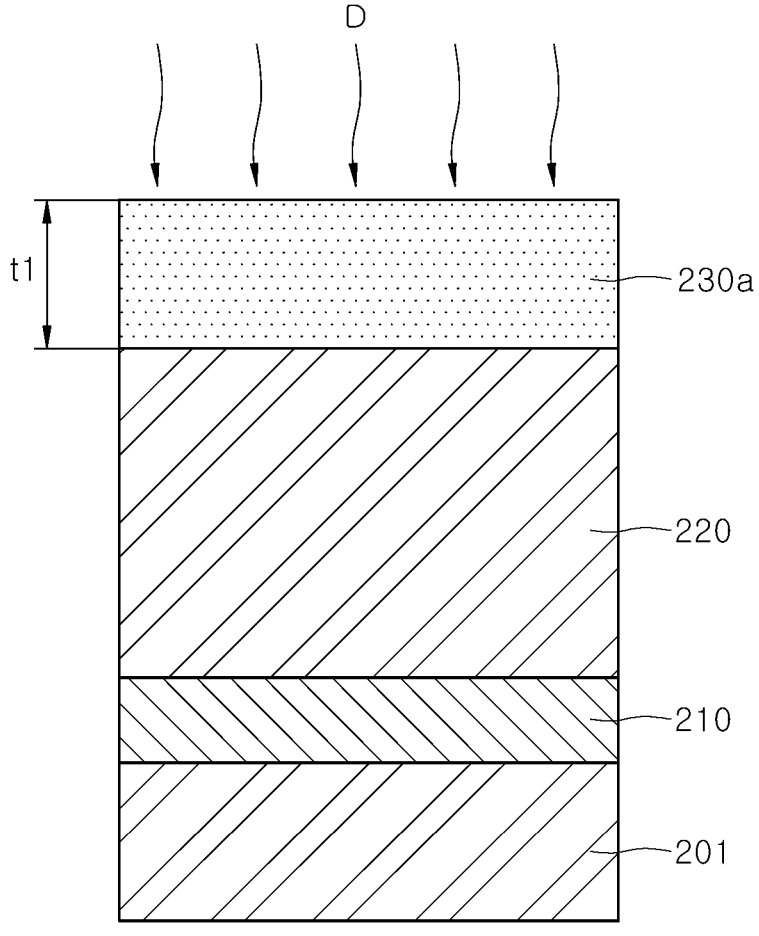

Referring to FIG. 7B, a first sub-dielectric layer 230a having a non-ferroelectric property may be formed on the ferroelectric layer 220. In an embodiment, the first sub-dielectric layer 230a may have a paraelectric property. The first sub-dielectric layer 230a may have a first thickness t1.

The first sub-dielectric layer 230a may include, for example, hafnium oxide, zirconium oxide, or a combination thereof. The first sub-dielectric layer 230a may have a crystal structure that is different from the crystal structure of the ferroelectric layer 220. The first sub-dielectric layer 230a may have a crystal structure of a monoclinic crystal system or the tetragonal crystal system. The first sub-dielectric layer 230a may be formed, for example, using a chemical vapor deposition method, an atomic layer deposition method, a pulsed-laser deposition method, or the like.

Subsequently, a doping process with respect to the first sub-dielectric layer 230a may be performed. The doping process may be performed by providing a dopant gas D to the first sub-dielectric layer 230a. Dopant particles decomposed from the dopant gas D may be injected into a surface region of the first sub-dielectric layer 230a.

The dopant gas D may be a reactive gas such as boron (B), aluminum (Al), gallium (Ga), indium (In), phosphorus (P), arsenic (As), antimony (Sb), bismuth (Bi), silicon (Si), or a combination of two or more thereof.

Figure 7C:
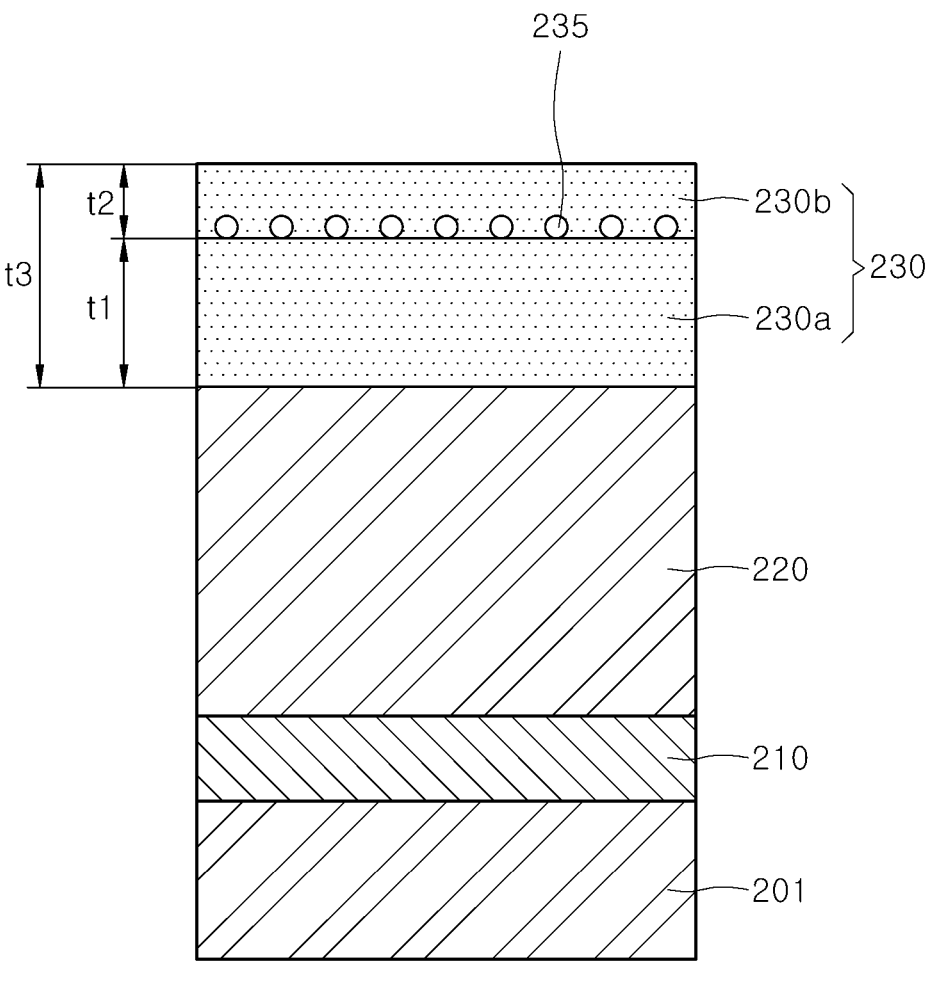

Referring to FIG. 7C, a second sub-dielectric layer 230b having a non-ferroelectric property may be formed on the first sub-dielectric layer 230a. In an embodiment, the second sub-dielectric layer 230b may have a second thickness t2. The second sub-dielectric layer 230b may be formed of the same material as the first sub-dielectric layer 230a. The method of forming the second sub-dielectric layer 230b may be substantially the same as the method of forming the first sub-dielectric layer 230a.

In an embodiment, the process of forming the first sub-dielectric layer 230a and the process of providing the dopant gas D of FIG. 7B, and the process of forming the second sub-dielectric layer 230b of FIG. 7C, may be performed as an in-situ processes.

The first and second sub-dielectric layers 230a and 230b may constitute a dielectric layer 230 having a third thickness t3. Dopant particles 235 injected from the dopant gas D may be distributed in an inner region of the dielectric layer 230. The dopant particles 235 may have a peak concentration in an inner region of the dielectric layer 230 corresponding to the first thickness t1 as measured from the interface with the ferroelectric layer 220. The distribution and concentration of the dopant particles 235 may be substantially the same as the concentration distribution of the charge trap sites 135 described above with reference to FIG. 5.

Figure 7D:
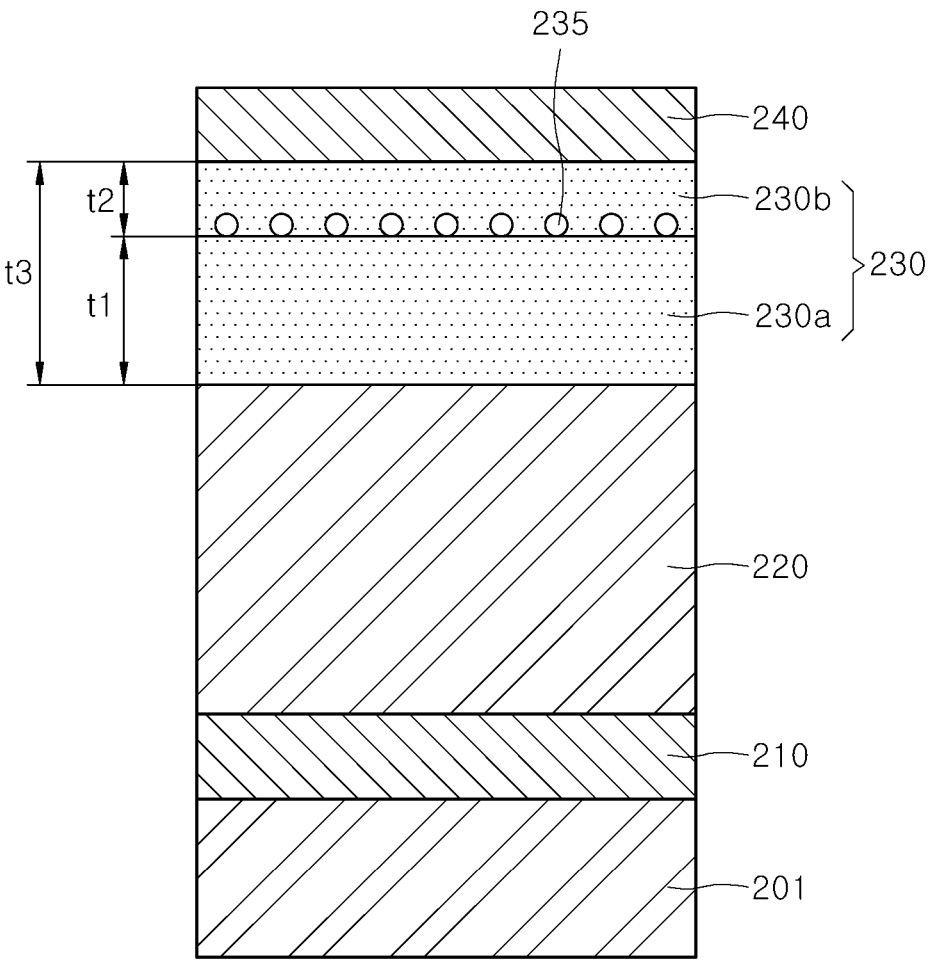

Referring to FIG. 7D, a second electrode 240 may be formed on the dielectric layer 230. The second electrode 240 may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The second electrode 240 may be formed of substantially the same material as the first electrode layer. By performing the above-described processes, a semiconductor device according to an embodiment of the present disclosure may be manufactured.

In other embodiments (not illustrated), the process of forming the dielectric layer 230 illustrated in FIGS. 7B and 7C may be performed without forming the ferroelectric layer 220 on the first electrode 210 of FIG. 7A. Subsequently, a ferroelectric layer 220 may be formed on the dielectric layer 230. Then, the second electrode 240 of FIG. 7D may be formed on the ferroelectric layer 220. The resulting semiconductor device may be manufactured with the first electrode 210, the dielectric layer 230, the ferroelectric layer 220, and the second electrode 240 sequentially stacked on the substrate 201.

FIGS. 8A to 8D are cross-sectional views schematically illustrating a method of fabricating a semiconductor device according to another embodiment of the present disclosure.

Figure 8A:
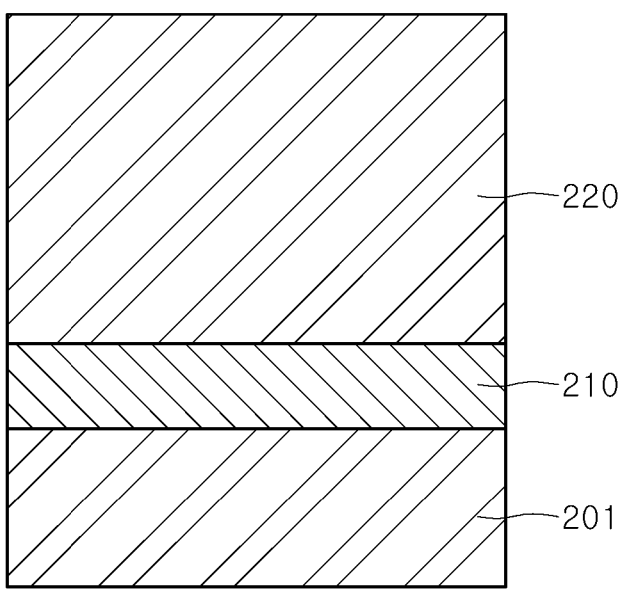
FIGS. 8A to 8D are cross-sectional views schematically illustrating a method of fabricating a semiconductor device according to another embodiment of the present disclosure.
Figure 8B:
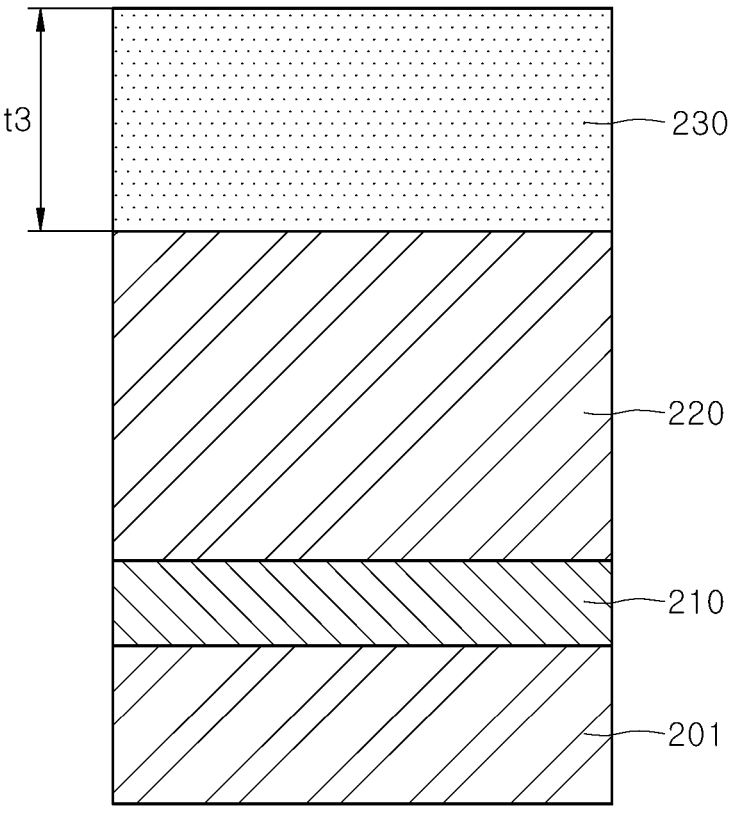

Referring to FIG. 8A, a first electrode 210 and a ferroelectric layer 220 may be sequentially formed on a substrate 201. Referring to FIG. 8B, a dielectric layer 230 having a non-ferroelectric property and a third thickness t3 may be formed on the ferroelectric layer 220.

Figure 8C:
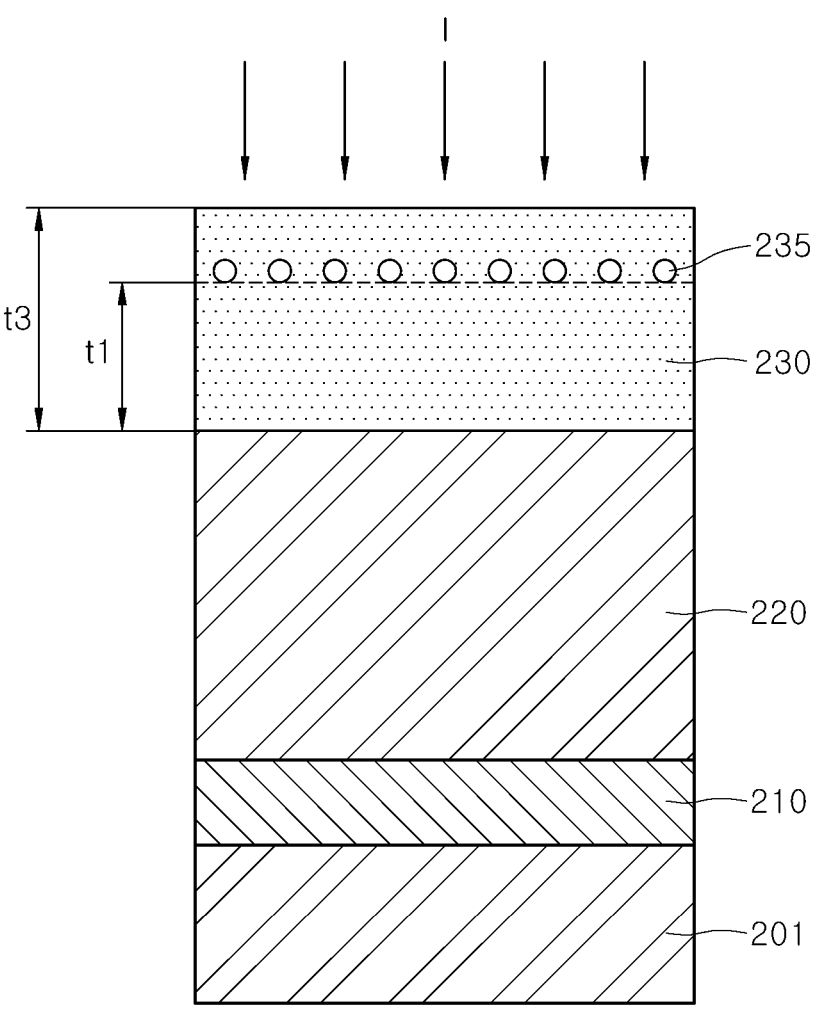

Referring to FIG. 8C, dopant ion implantation I may be performed with respect to the dielectric layer 230. The dopant ion implantation I may be performed so that dopant particles 235 are distributed in an inner region of the dielectric layer 230. In an embodiment, the dopant particles 235 may have a peak concentration in an inner region of the dielectric layer 230 that corresponds to a first thickness t1 from the interface with the ferroelectric layer 220. The concentration and distribution of the dopant particles 235 may be substantially the same as the concentration and distribution of the charge trap sites 135 described above with reference to FIG. 5.

Figure 8D:
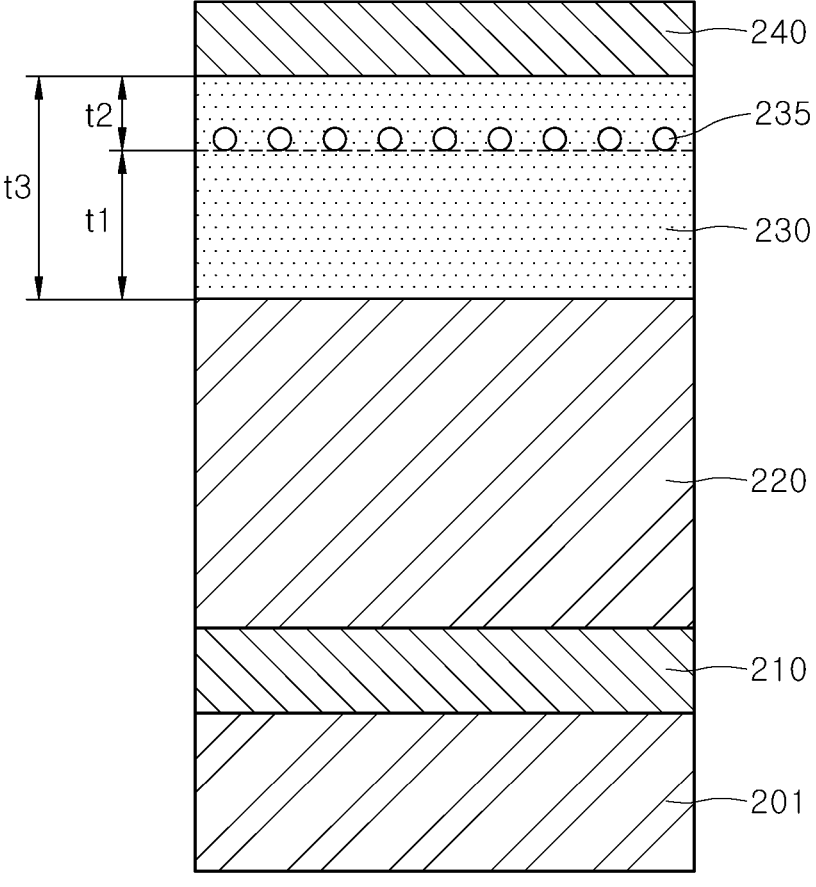

Referring to FIG. 8D, a second electrode 240 may be formed on the dielectric layer 230. By performing the processes, a semiconductor device according to an embodiment of the present disclosure may be manufactured.

In other embodiments (not illustrated), the process of forming the dielectric layer 230 illustrated in FIGS. 8B and 8D may be performed without forming the ferroelectric layer 220 on the first electrode 210 as illustrated in FIG. 8A. Subsequently, a ferroelectric layer 220 may be formed on the dielectric layer 230. Then, the second electrode 240 of FIG. 8D may be formed on the ferroelectric layer 220. As a result, a semiconductor device may be manufactured in which the first electrode 210, the dielectric layer 230, the ferroelectric layer 220, and the second electrode 240 are sequentially stacked on the substrate 201.

FIGS. 9A to 9D are cross-sectional views schematically illustrating a method of fabricating a semiconductor device according to a further embodiment of the present disclosure.

12

Figure 9A:
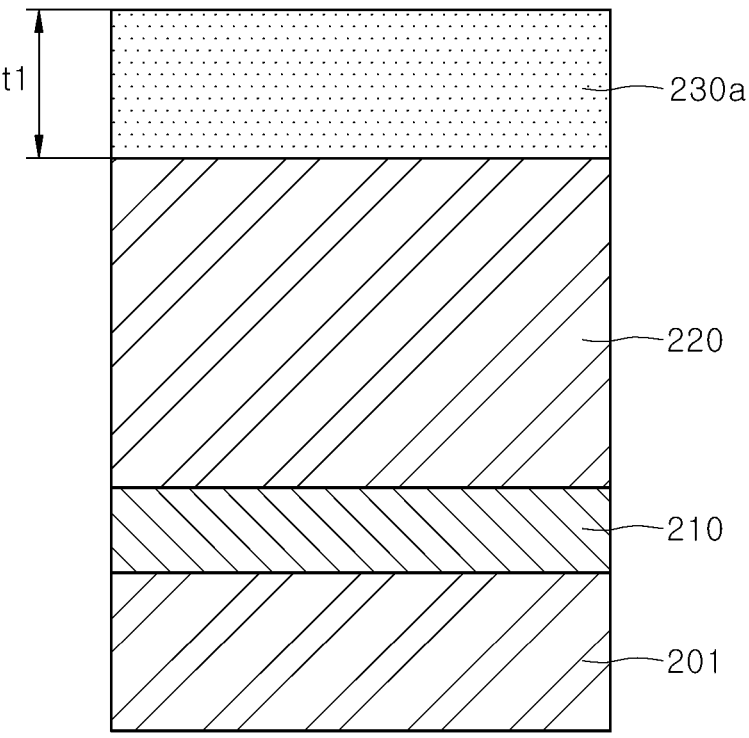
FIGS. 9A to 9D are cross-sectional views schematically illustrating a method of fabricating a semiconductor device according to a further embodiment of the present disclosure.

Referring to FIG. 9A, a first electrode layer 210 and a ferroelectric layer 220 may be sequentially formed on a substrate 201. A first sub-dielectric layer 230a having a first thickness t1 may be formed on the ferroelectric layer 220.

Figure 9B:
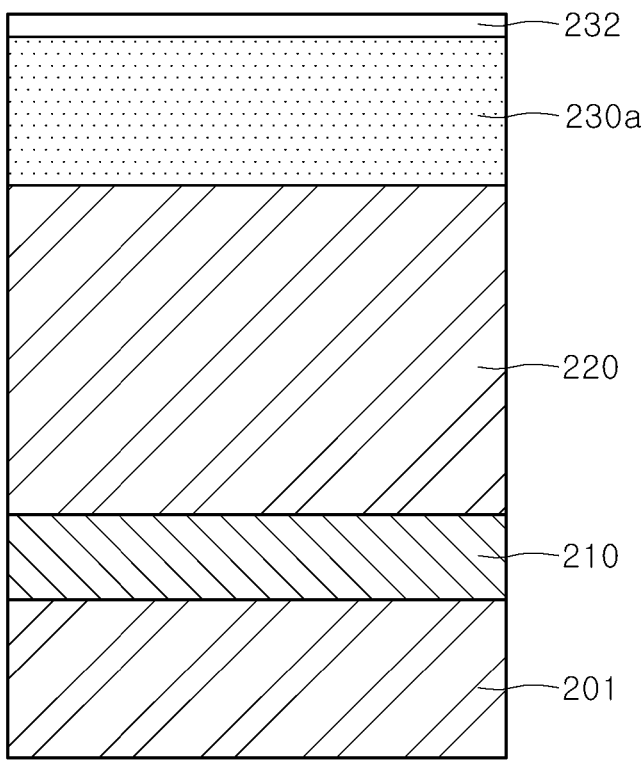

Referring to FIG. 9B, a metal layer 232 having a predetermined thickness may be formed on the first sub-dielectric layer 230a. The metal layer 232 may have a thickness of, for example, 0.1 nm to 3 nm. The metal layer 232 may be formed, for example, using a chemical vapor deposition method, an atomic layer deposition method, a pulsed-laser deposition method, or the like. The metal layer 232 may include, for example, cobalt (Co), nickel (Ni), copper (Cu), iron (Fe), platinum (Pt), gold (Au), silver (Ag), iridium (Ir), ruthenium (Ru), palladium (Pd), manganese, or a combination of two or more thereof.

Figure 9C:
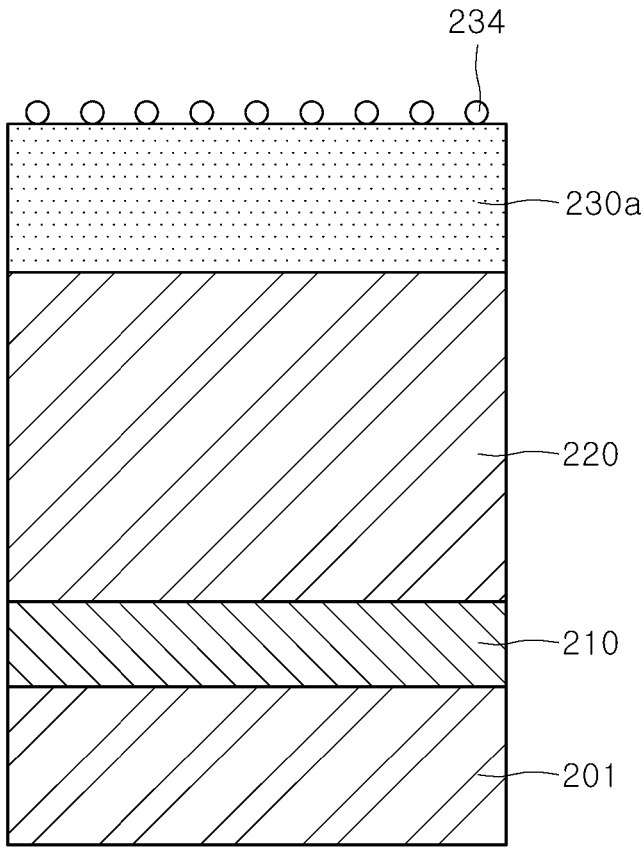

Referring to FIG. 9C, a plurality of metal particles 234 may be formed by self-aggregation of the metal layer (232 of FIG. 9B). The metal particles 234 may be uniformly distributed on the first sub-dielectric layer 230a.

Figure 9D:
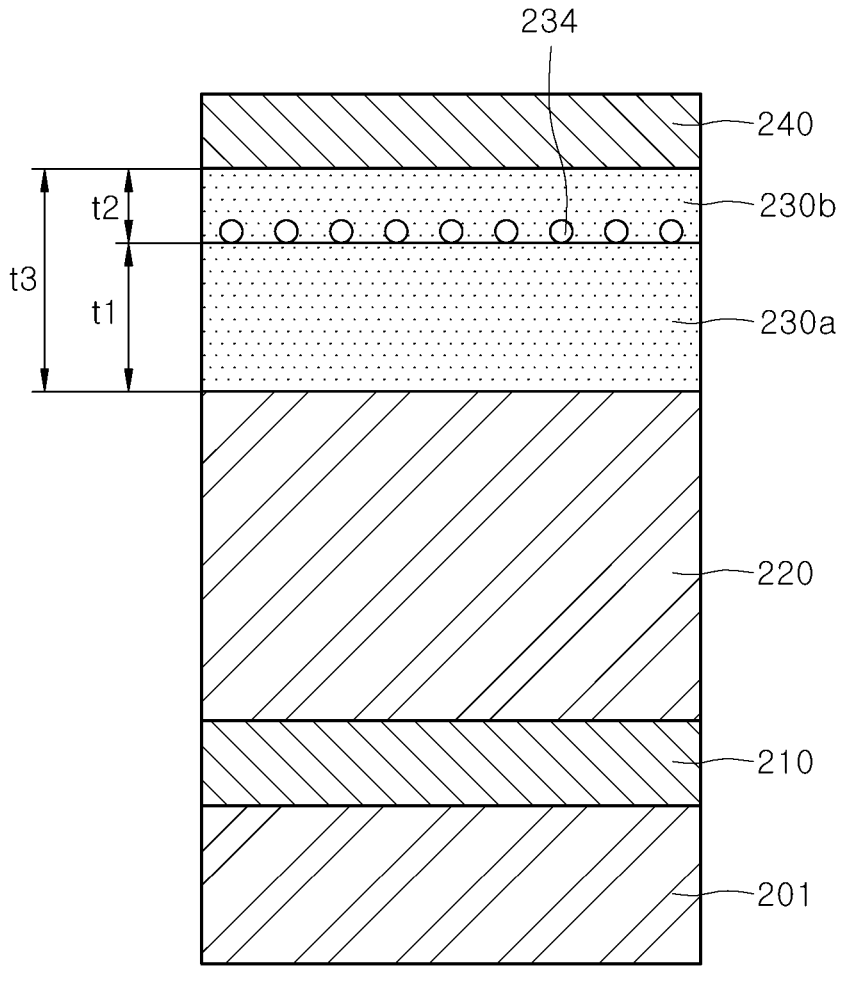

Referring to FIG. 9D, a second sub-dielectric layer 230b covering the metal particles 234 may be formed on the first sub-dielectric layer 230a. The second sub-dielectric layer 230b may be formed to have a second thickness t2.

The first and second sub-dielectric layers 230a and 230b may constitute a dielectric layer 230 having a third thickness t3. The metal particles 234 may be distributed in an inner region of the dielectric layer 230, corresponding to the first thickness t1 from the interface with ferroelectric layer 220.

Next, a second electrode 240 may be formed on the dielectric layer 230. By performing these processes, a semiconductor device according to an embodiment of the present disclosure may be manufactured.

In other embodiments (not illustrated), the process of forming the dielectric layer 230 associated with FIGS. 9A to 9D may be performed without forming the ferroelectric layer 220 on the first electrode 210 as illustrated in FIG. 9A. Subsequently, a ferroelectric layer 220 may be formed on the dielectric layer 230. Then, the second electrode 240 of FIG. 9D may be formed on the ferroelectric layer 220. As a result, the first electrode 210, the dielectric layer 230, the ferroelectric layer 220, and the second electrode 240 may be sequentially stacked on the substrate 201.

Figure 10A:
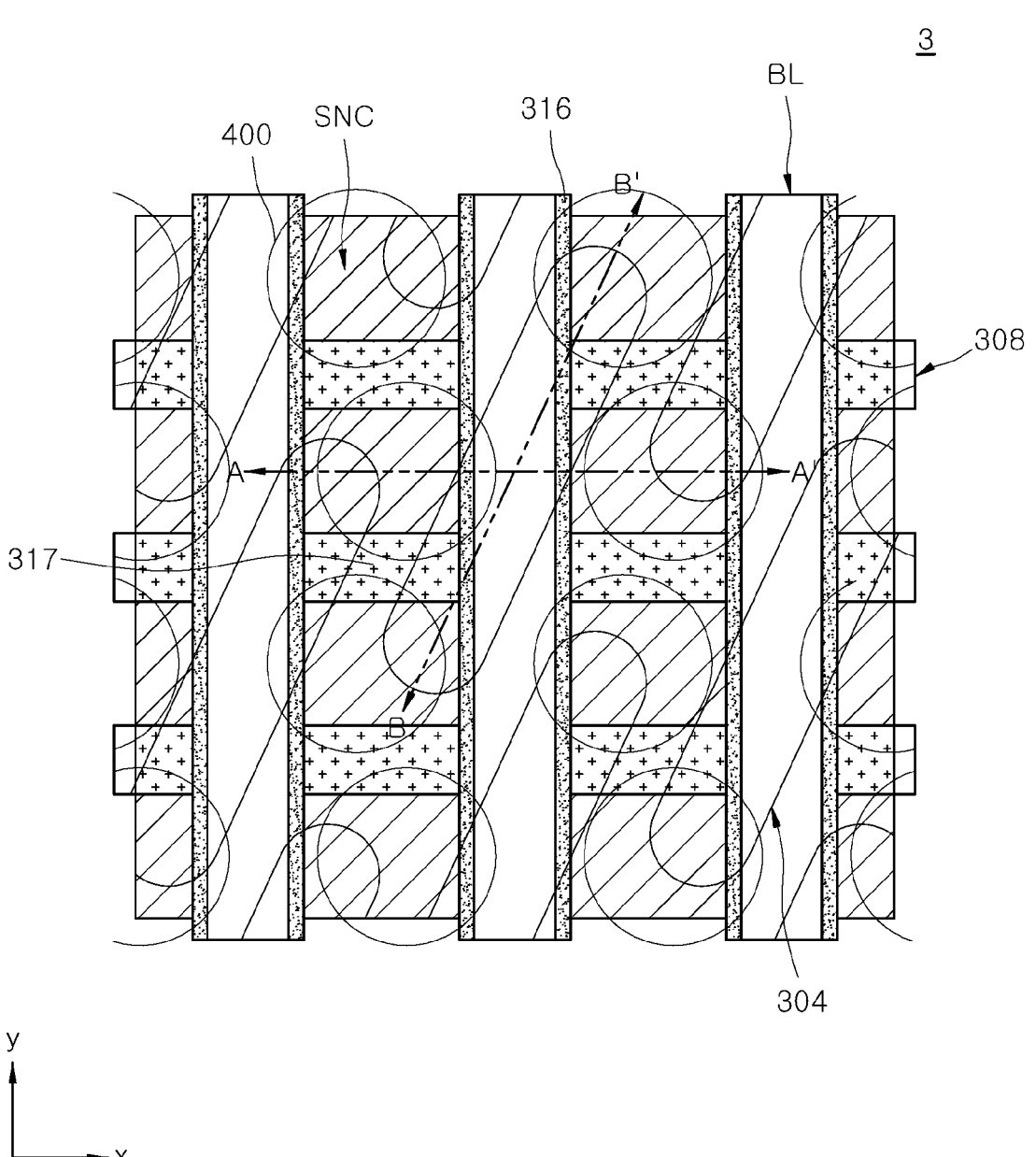
FIG. 10A is a plan view schematically illustrating a semiconductor device including a plurality of memory cells according to an embodiment of the present disclosure.
Figure 10B:
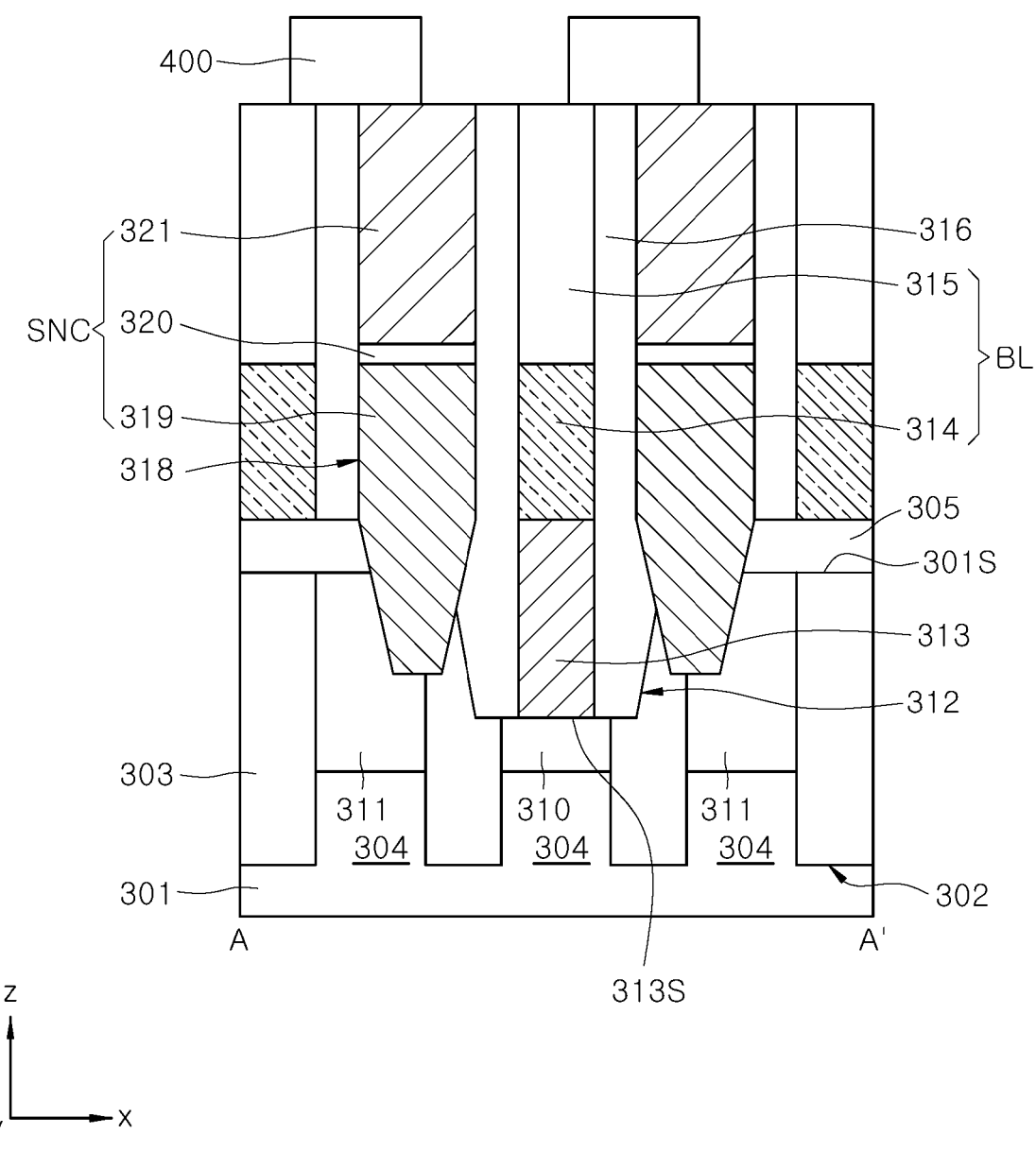
FIG. 10B is a cross-sectional view taken along a line A-A' of the semiconductor device of FIG. 10A.
Figure 10C:
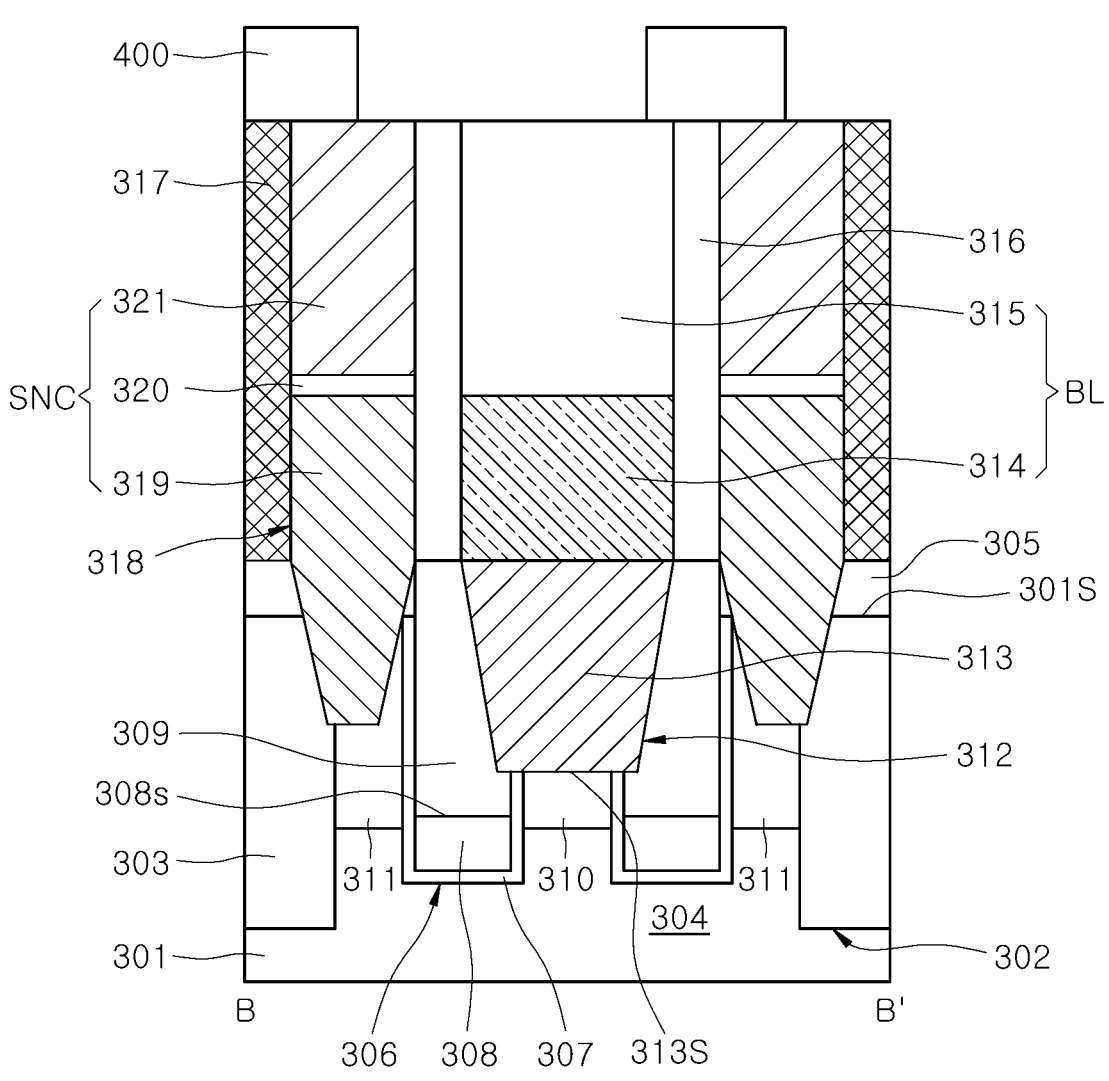
FIG. 10C is a cross-sectional view taken along a line B-B' of the semiconductor device of FIG. 10A.

FIG. 10A is a plan view schematically illustrating a semiconductor device 3 including a plurality of memory cells according to an embodiment of the present disclosure. FIG. 10B is a cross-sectional view taken along a line A-A' of the semiconductor device 3 of FIG. 10A. FIG. 10C is a cross-sectional view taken along a line B-B' of the semiconductor device 3 of FIG. 10A.

Referring to FIGS. 10A to 10C, the semiconductor device 3 may include a plurality of memory cells arranged in a matrix form. Each of the memory cells may include a cell transistor with a buried gate 308 and disposed in a substrate 301, a bit line 314, and a capacitor 400. The buried gate 308 may function as a buried word line 308 of the memory cell.

The substrate 301 may include a semiconductor material. The substrate 301 may include device isolation layers 303 and active regions 304. The active regions 304 may be doped with an n-type dopant or a p-type dopant. Cell regions in the active regions may be doped with a p-type dopant. The active regions 304 may be defined as regions of the substrate 301, separated by the device isolation layers 303. The device isolation layers 303 may be formed by a shallow trench isolation (STI) process, and may be disposed in device isolation trenches 302 formed in the substrate 301.

Referring to FIG. 10C, word line trenches 306 may be disposed in the substrate 301. A gate insulation layer 307 may be disposed on an inner surface of each of the word line trenches 306. The buried word line 308 may partially fill each of the word line trenches 306.

A word line capping layer 309 may be disposed on the buried word line 308 in each of the word line trenches 306. An upper surface 308S of the buried word line 308 may be located at a level that is lower than a surface 301S of the substrate 301 in the z-direction. The buried word line 308 may include a conductive material. In an embodiment, the buried word line 308 may be a thin film structure including a titanium nitride layer and a tungsten layer. In another embodiment, the buried word line 308 may be formed of a single titanium nitride layer or a single tungsten layer.

Referring to FIGS. 1013 and 10C, first and second doping regions 310 and 311 may be formed in the active regions 304 of the substrate 301. The first and second doping regions 310 and 311 may be spaced apart from each other by the word line trenches 306. One of the first and second doping regions 310 and 311 may be a source region of the cell transistor, and the other may be a drain region of the cell transistor. The first and second doping regions 310 and 311 may include an n-type dopant such as arsenic (As) or phosphorus (P).

As described above, the buried word line 308 and the first and second doping regions 310 and 311 may constitute the cell transistor. The buried word line 308 may extend in the x-direction of FIG. 10A.

Referring to FIGS. 10B and 10C, a bit line contact plug 313 may be disposed over the substrate 301. The bit line contact plug 313 may be electrically connected to the first doping region 310. The bit line contact plug 313 may be disposed in a bit line contact hole 312. The bit line contact hole 312 may be disposed to penetrate a hard mask layer 305 disposed on the substrate 301 and may extend into the substrate 301. A bottom surface 313S of the bit line contact plug 313 may be located at a lower level than an upper surface 301S of the substrate 301. The bit line contact plug 313 may include a conductive material. A bit line structure BL may be disposed over the bit line contact plug 313. The bit line structure BL may include a bit line 314 in contact with the bit line contact plug 313, and a bit line hard mask 315 disposed on the bit line 314. Although one bit line structure BL is illustrated in FIGS. 10B and 10C, the semiconductor device 3 may include a plurality of bit line structures BL disposed parallel to each other across the buried word lines 308, as illustrated in FIG. 10A.

Referring to FIGS. 10A to 10C, the bit lines 314 may extend in a direction (e.g., y-direction) crossing the buried word lines 308. The bit lines 314 may be electrically connected to the first doping regions 310 through the bit line contact plugs 313. The bit line 314 may include a conductive material. The bit line hard mask 315 may include an insulation material.

Bit line spacers 316 may be disposed on sidewalls of each of the bit line structures BL. The bit line spacers 316 may extend to cover both sidewalls of each of the bit line contact plugs 313. In an embodiment, the bit line spacer 316 may include silicon oxide, silicon nitride, or a combination thereof. In another embodiment, the bit line spacer 316 may include an air gap. In an embodiment, the bit line spacer 316 may have a nitride-air gap-nitride (NAN) structure in which an air gap is located between silicon nitride layers.

Storage node contact plugs SNC may be disposed between the bit line structures BL. The storage node contact plugs SNC may be disposed in storage node contact holes 318. The storage node contact plugs SNC may be electrically connected to the second doping regions 311. In an embodiment, each of the storage node contact plugs SNC may include a lower plug 319 and an upper plug 321. Each of the storage node contact plugs SNC may further include an ohmic contact layer 320 disposed between the lower plug 319 and the upper plug 321. In an embodiment, the upper plug 321 may include metal, the lower plug 319 may include doped silicon (Si), and the ohmic contact layer 320 may include metal silicide.

Referring to FIG. 10C, a plug separation layer 317 may be disposed on the hard mask layer 305. The plug separation layer 317 may be an insulating layer disposed between the adjacent bit line structures BL. The storage node contact hole 318 may be formed over the active regions 304 and through the plug separation layer 317 and the hard mask layer 305.

Referring to FIGS. 10A to 10C, a capacitor 400 may be disposed on each of the storage node contact plugs SNC. Each of the capacitors 400 may include the configuration of a semiconductor device 1 of FIG. 4 or a semiconductor device 2 of FIG. 6. The configuration of the capacitor 400 will be described with reference to FIGS. 11A to 13B.

Figure 11A:
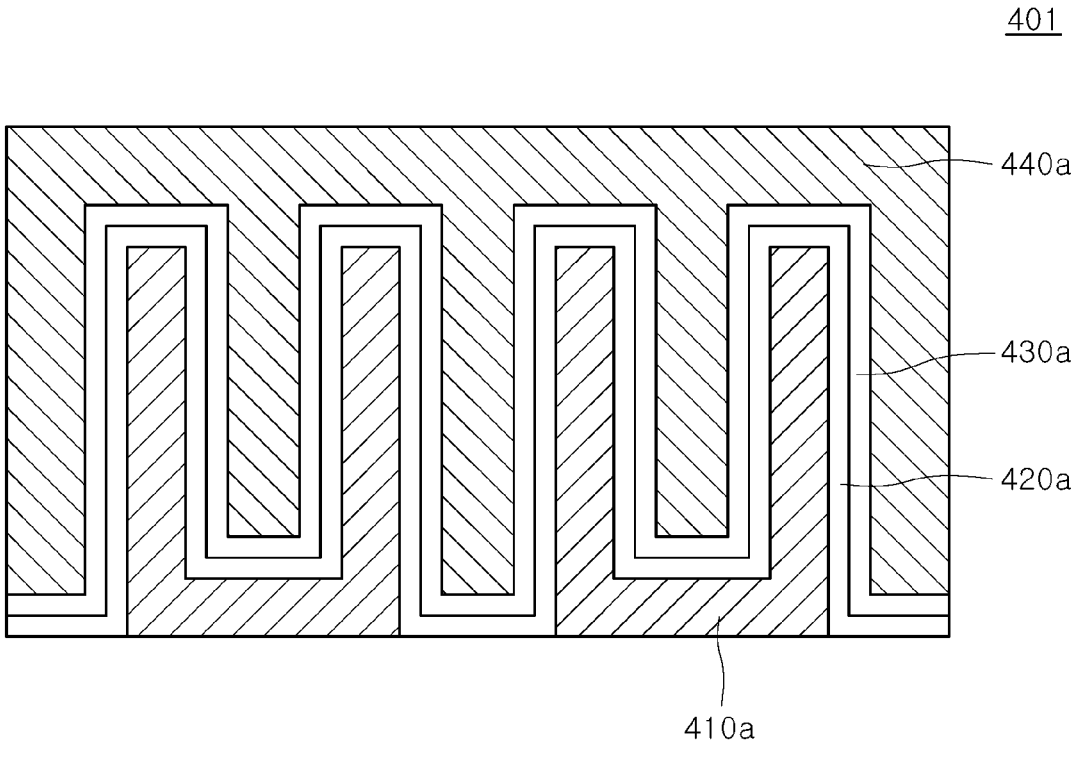
FIGS. 11A and 11B are cross-sectional views schematically illustrating capacitors of a semiconductor device according to embodiments of the present disclosure.
Figure 11B:
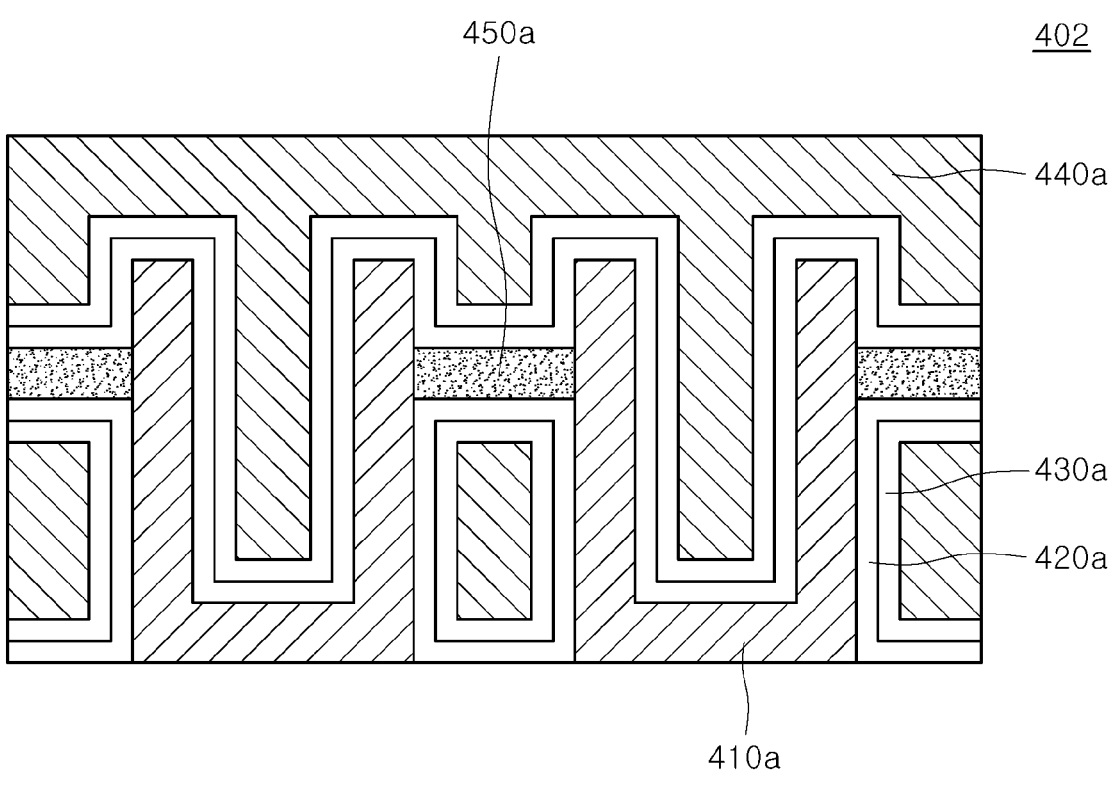

FIGS. 11A and 11B are cross-sectional views schematically illustrating capacitors 401 and 402 of a semiconductor device according to embodiments of the present disclosure. The capacitors 401 and 402 may be applied to the capacitor 400 of a semiconductor device 3 of FIGS. 10A to 10C. FIG. 11A illustrates two capacitors 401 arranged side by side, and FIG. 11B illustrates two capacitors 402 arranged side by side.

Referring to FIG. 11A, each of the capacitors 401 may include a storage node electrode 410a, a ferroelectric layer 420a disposed on the storage node electrode 410a, a dielectric layer 430a disposed on the ferroelectric layer 420a, and a plate electrode 440a disposed on the dielectric layer 430a. Although not illustrated, charge trap sites may be disposed in an inner region of the dielectric layer 430a. The storage node electrode 410a may be disposed on a storage node contact plug SNC of a memory cell of a semiconductor device 3 described above with reference to FIGS. 10A to 10C. The storage node electrode 410a may be electrically connected to the second doping region (311 of FIG. 10C) of the substrate (301 of FIG. 10C) through the storage node contact plug SNC.

Referring to FIG. 11A, the storage node electrode 410 may have a cylindrical shape that may be open at one end. The ferroelectric layer 420a may be disposed to cover the cylindrical storage node electrode 410a. The dielectric layer 430a may be disposed to cover the ferroelectric layer 420a. The plate electrode 440a may be disposed to cover the dielectric layer 430a.

In an embodiment, the capacitor 401 may be a semiconductor device 1 described with reference to FIG. 4. In an embodiment, the storage node electrode 410a and the plate electrode 440a of the capacitor 401 may correspond respectively to the first electrode 110 and the second electrode 140 of the semiconductor device 1. In addition, the ferroelectric layer 420a and the dielectric layer 430a of the capacitor 401 may correspond respectively to the ferroelectric layer 120 and the dielectric layer 130 of the semiconductor device 1. In addition, the capacitor 401 may include charge trap sites distributed in an inner region of the dielectric layer 430a. The charge trap sites may correspond to the charge trap sites 135 of a semiconductor device 1.

In another embodiment, the capacitor 401 may be a semiconductor device 2 described with reference to FIG. 6. As discussed above, the semiconductor device 2 of FIG. 6 may further include first to third barrier insulation layers 150, 160, and 170 when compared to the semiconductor device 1 of FIG. 1. Correspondingly, although not illustrated in FIG. 11A, the capacitor 401 may further include a first barrier insulation layer disposed between the ferroelectric layer 420a and the dielectric layer 430a, a second barrier insulation layer disposed between the storage node electrode 410a and the ferroelectric layer 420a, and a third barrier insulation layer disposed between the dielectric layer 430a and the plate electrode 440a.

Referring to FIG. 11B, each of the capacitors 402 may further include a supporter 450a for physically connecting the storage node electrode 410a to a neighboring storage electrode 410a when compared to the capacitor 401 of FIG. 11A. The supporter 450a may provide lateral support to an outer wall of the storage node electrode 410a. The supporter 450a may improve the structural stability of the storage node electrode 410a. The supporter 450a may include, for example, silicon nitride.

In some embodiments other than those shown in FIGS. 11A and 11B, instead of sequentially disposing the ferroelectric layer 420a and the dielectric layer 430a on the storage node electrode 410a, the dielectric layer 430a may be disposed on the storage node electrode 410a and the ferroelectric layer 420a may be disposed on the dielectric layer 430a. Accordingly, the plate electrode 440a may be disposed on the ferroelectric layer 420a.

Figure 12A:
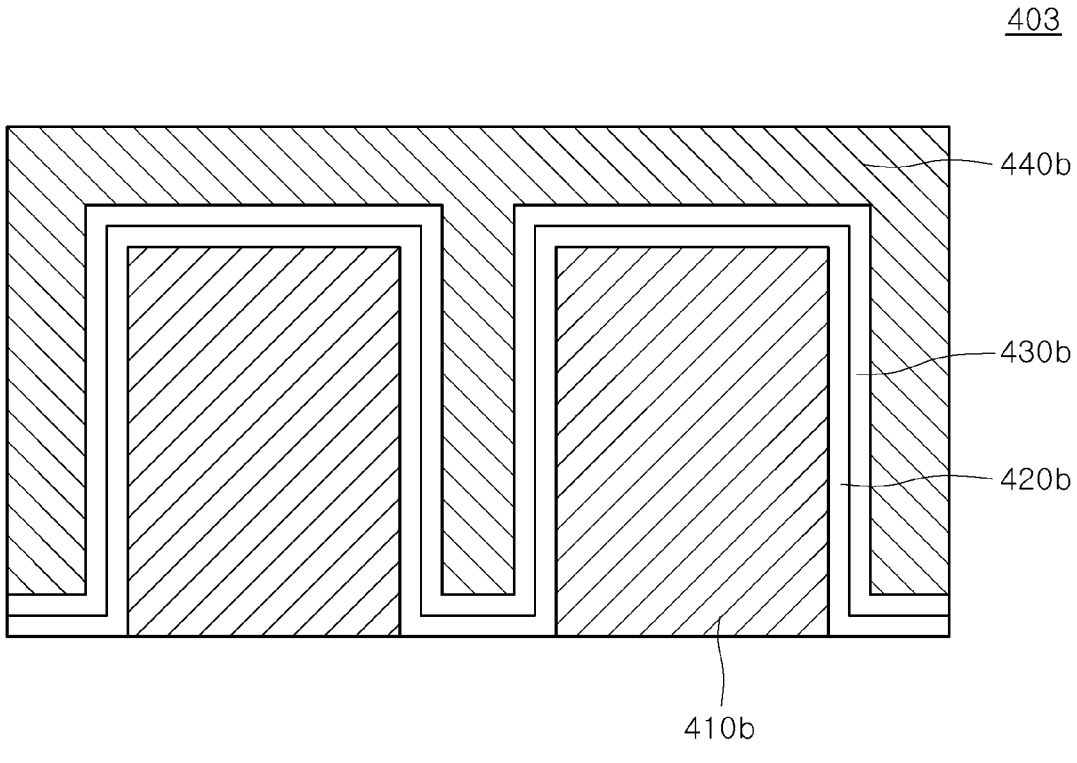
FIGS. 12A and 12B are cross-sectional views schematically illustrating capacitors according to other embodiments of the present disclosure.
Figure 12B:
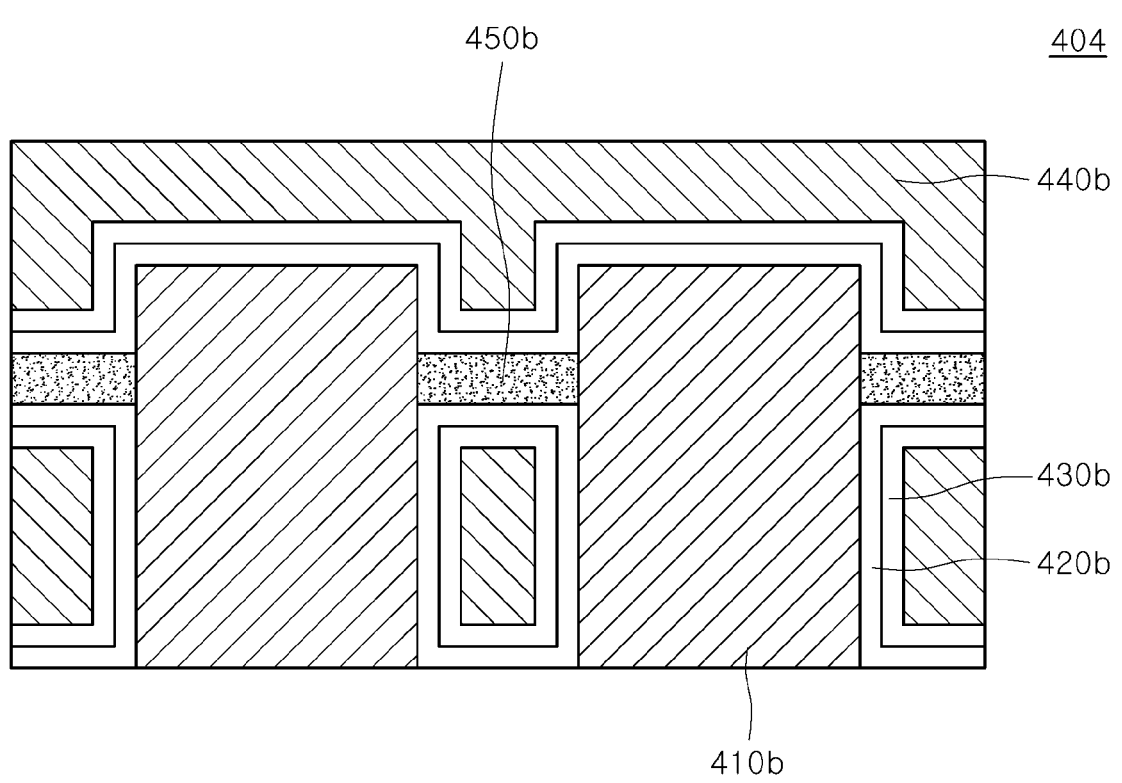

FIGS. 12A and 12B are cross-sectional views schematically illustrating capacitors 403 and 404 according to other embodiments of the present disclosure. The capacitors 403 and 404 may be applied to the capacitor 400 of a memory cell of a semiconductor device 3 of FIGS. 10A to 10C. FIG. 12A illustrates two capacitors 403 arranged side by side, and FIG. 12B illustrates two capacitors 404 arranged side by side.

Referring to FIG. 12A, each of the capacitors 403 may include a storage electrode 410b, a ferroelectric layer 420b disposed on the storage node electrode 410b, a dielectric layer 430b disposed on the ferroelectric layer 420b, and a plate electrode 440b disposed on the dielectric layer 430b.

The capacitor 403 may be different from the capacitor 401 of FIG. 11A in a shape of the storage node electrode 410b. The storage node electrode 410b may have a pillar shape. Accordingly, the ferroelectric layer 420b may be disposed to cover an outer wall surface of the storage node electrode 410b. The configuration of the capacitor 403, other than the shape of the storage node electrode 410b, may be substantially the same as the configuration of the capacitor 401 of FIG. 11A.

Referring to FIG. 12B, compared to the capacitor 403 of FIG. 12A, each of the capacitors 404 may further include a supporter 450b for physically connecting the storage node electrode 410b to a neighboring storage electrode 410b. The supporter 450b may serve to physically support the outer wall of the storage node electrode 410b in a lateral direction. The supporter 450b may improve the structural stability of the storage node electrode 410b. The supporter 450b may include, for example, silicon nitride.

Figure 13A:
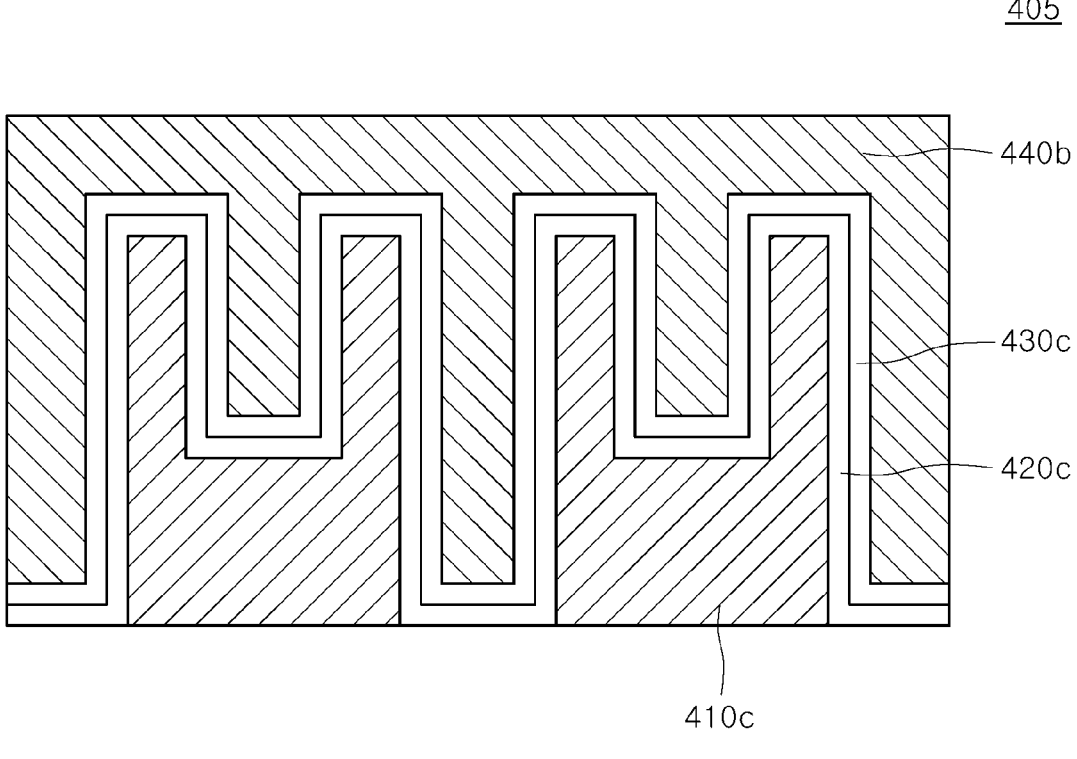
FIGS. 13A and 13B are cross-sectional views schematically illustrating capacitors according to further embodiments of the present disclosure.
Figure 13B:
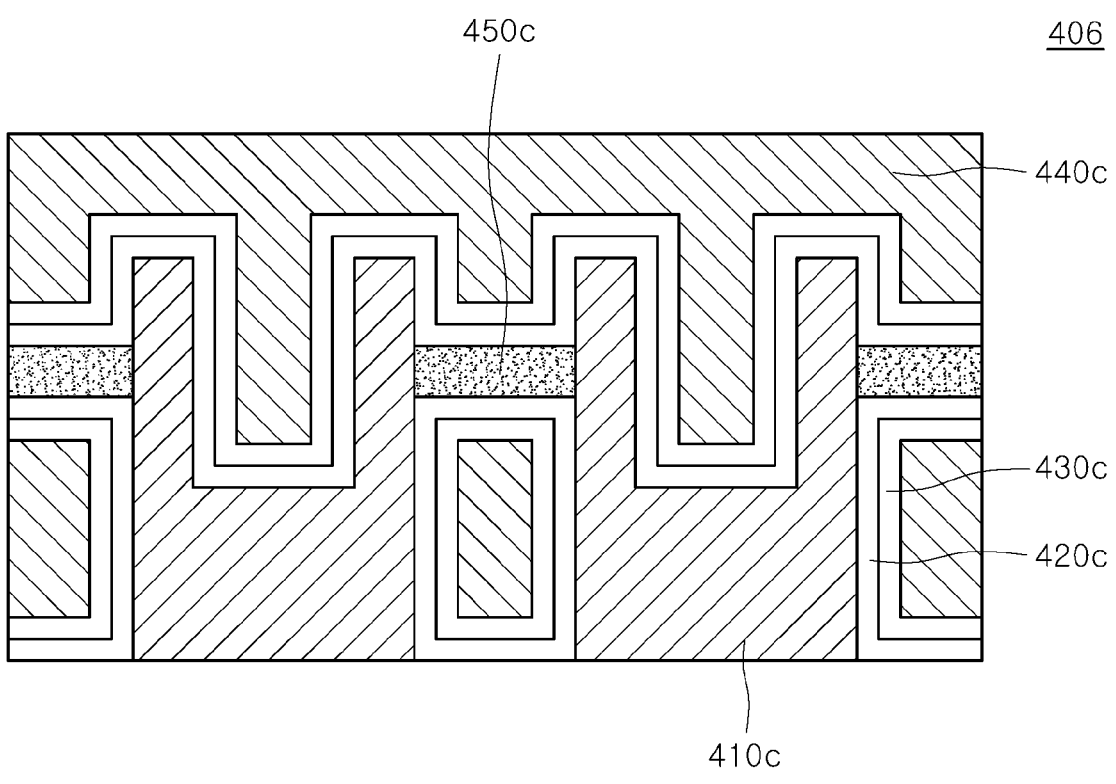

FIGS. 13A and 13B are cross-sectional views schematically illustrating capacitors 405 and 406 according to further embodiments of the present disclosure. The capacitors 405 and 406 may be applied to the capacitor 400 of a memory cell of a semiconductor device 3 of FIGS. 10A to 10C. FIG. 13A illustrates two capacitors 405 arranged side by side, and FIG. 13B illustrates two capacitors 406 arranged side by side.

Referring to FIG. 13A, each of the capacitors 405 may include a storage electrode 410c, a ferroelectric layer 420c disposed on the storage node electrode 410c, a dielectric layer 430c disposed on the ferroelectric layer 420c, and a plate electrode 440c disposed on the dielectric layer 430c.

The capacitor 405 may be different from the capacitor 401 of FIG. 11A in a shape of the storage node electrode 410c. The shape of the storage node electrode 410c may be a combination of the cylindrical shape of the storage node electrode 410a of FIG. 11A and the pillar shape of the storage node electrode 410b of FIG. 12A. The configuration of the capacitor 405 other than the shape of the storage node electrode 410c may be substantially the same as the configuration of the capacitor 401 of FIG. 11A.

Referring to FIG. 13B, each of the capacitors 406 may further include a supporter 450c for physically connecting the storage node electrode 410c to a neighboring storage electrode 410c, compared to the capacitor 405 of FIG. 12A. The supporter 450c may serve to physically support the outer wall of the storage node electrode 410c. The supporter 450c may improve the structural stability of the storage node electrode 410c. The supporter 450c may include, for example, silicon nitride.

As described above, according to an embodiment of the present disclosure, a semiconductor device may include a ferroelectric layer and a dielectric layer having a non-ferroelectric property, which are disposed between a first electrode and a second electrode layer and connected in series to each other. In addition, the semiconductor device may include charge trap sites distributed in an inner region of the dielectric layer having a non-ferroelectric property.

In the embodiment of the present disclosure, through selection of the ferroelectric layer and the dielectric layer, it is possible for the semiconductor device to maintain a sufficiently low level of leakage current and to secure a high capacitance. The charge trap sites may increase the amount of charges in the dielectric layer through electron trapping and de-trapping operations. In addition, the charge trap sites may suppress movement of electrons injected from the second electrode to the ferroelectric layer when a voltage is applied between the first electrode and the second electrode. Through the above-described configurations, operational reliability of the semiconductor device may be improved.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
   a first electrode;
   a ferroelectric layer disposed over the first electrode;
   a first sub-dielectric layer disposed over the ferroelectric layer;
   a plurality of self-aggregated metal particles disposed on the first sub-dielectric layer, the plurality of self-aggregated metal particles formed from a metal layer having a thickness of 0.1 nm to 3 nm;
   a second sub-dielectric layer disposed over the first sub-dielectric layer, the second sub-dielectric layer covering the plurality of self-aggregated metal particles; and
   a second electrode disposed over the second sub-dielectric layer,
   wherein the first sub-dielectric layer is made of the same material as the second sub-dielectric layer.

2. The semiconductor device of claim 1, wherein the plurality of self-aggregated metal particles comprise at least one selected from the group consisting of cobalt (Co), nickel (Ni), copper (Cu), iron (Fe), platinum (Pt), gold (Au), silver (Ag), iridium (Ir), ruthenium (Ru), palladium (Pd), and manganese (Mn).

3. The semiconductor device of claim 1, wherein the ferroelectric layer comprises at least one selected from hafnium oxide and hafnium zirconium oxide.

4. The semiconductor device of claim 1,
wherein the ferroelectric layer comprises at least one dopant, and
wherein the dopant comprises at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

5. The semiconductor device of claim 1, wherein the first sub-dielectric layer and the second sub-dielectric layer comprise at least one selected from hafnium oxide and hafnium zirconium oxide.

6. The semiconductor device of claim 1, wherein the plurality of self-aggregated metal particles trap or de-trap electrons according to a polarity of a voltage applied between the first electrode and the second electrode.

7. The semiconductor device of claim 1, wherein each of the ferroelectric layer has a thickness of 1 nm to 4 nm.

8. The semiconductor device of claim 1, further comprising a first barrier insulation layer and a second barrier insulation layer,
wherein the first barrier insulation layer is disposed between the ferroelectric layer and the first sub-dielectric layer, wherein the second barrier insulation layer is disposed at least one of a first location between the first electrode and the ferroelectric layer and a second location between the second electrode and the second sub-dielectric layer.

9. The semiconductor device of claim 1, wherein the ferroelectric layer, the first sub-dielectric layer, and the second sub-dielectric layer are electrically connected in series.

10. A semiconductor device comprising:
a substrate;
a storage node electrode disposed over the substrate;
a plate electrode disposed to be spaced apart from the storage node electrode;
a ferroelectric layer disposed over the storage node electrode,
a first sub-dielectric layer disposed over the ferroelectric layer;
a plurality of self-aggregated metal particles disposed on the first sub-dielectric layer, the plurality of self-aggregated metal particles formed from a metal layer having a thickness of 0.1 nm to 3 nm;
a second sub-dielectric layer disposed over the first sub-dielectric layer, the second sub-dielectric layer covering the plurality of self-aggregated metal particles; and
a second electrode disposed over the second sub-dielectric layer,
wherein the first sub-dielectric layer is made of the same material as the second sub-dielectric layer.

* * * * *